(12) United States Patent
Weber et al.

(10) Patent No.: US 11,789,641 B2
(45) Date of Patent: Oct. 17, 2023

(54) THREE DIMENSIONAL CIRCUIT SYSTEMS AND METHODS HAVING MEMORY HIERARCHIES

(71) Applicant: Intel Corporation, Santa Clara, CA (US)

(72) Inventors: Scott Weber, Piedmont, CA (US); Jawad Khan, Portland, OR (US); Ilya Ganusov, San Jose, CA (US); Martin Langhammer, Salisbury (GB); Matthew Adiletta, Bolton, MA (US); Terence Magee, San Francisco, CA (US); Albert Fazio, Saratoga, CA (US); Richard Coulson, Portland, OR (US); Ravi Gutala, San Jose, CA (US); Aravind Dasu, Milpitas, CA (US); Mahesh Iyer, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/349,592

(22) Filed: Jun. 16, 2021

(65) Prior Publication Data

US 2022/0405005 A1    Dec. 22, 2022

(51) Int. Cl.
*G06F 3/06* (2006.01)

(52) U.S. Cl.
CPC ............ *G06F 3/0655* (2013.01); *G06F 3/061* (2013.01); *G06F 3/0673* (2013.01)

(58) Field of Classification Search
CPC ...... G06F 3/0655; G06F 3/061; G06F 3/0673; G11C 5/063; G11C 11/005; G11C 5/025
See application file for complete search history.

(56) References Cited

U.S. PATENT DOCUMENTS 10,291,397 B2    5/2019  McElheny et al.
10,666,265 B2    5/2020  Clark et al.
(Continued)

FOREIGN PATENT DOCUMENTS

WO    2020242781    12/2020

OTHER PUBLICATIONS

European Patent Office, Extended European Search Report and European Search Opinion for European patent application 22160217.0, dated Aug. 30, 2022.

*Primary Examiner* — Zhuo H Li
(74) *Attorney, Agent, or Firm* — InventIQ Legal LLP; Steven J. Cahill

(57) ABSTRACT

A three dimensional circuit system includes a first integrated circuit die having a core logic region that has first memory circuits and logic circuits. The three dimensional circuit system includes a second integrated circuit die that has second memory circuits. The first and second integrated circuit dies are coupled together in a vertically stacked configuration. The three dimensional circuit system includes third memory circuits coupled to the first integrated circuit die. The third memory circuits reside in a plane of the first integrated circuit die. The logic circuits are coupled to access the first, second, and third memory circuits and data can move between the first, second, and third memories. The third memory circuits have a larger memory capacity and a smaller memory access bandwidth than the second memory circuits. The second memory circuits have a larger memory capacity and a smaller memory access bandwidth than the first memory circuits.

23 Claims, 12 Drawing Sheets

(56) References Cited

U.S. PATENT DOCUMENTS

| | | |
|---|---|---|
| 10,833,679 B2 | 11/2020 | Clark et al. |
| 2018/0143777 A1 | 5/2018 | Dasu et al. |
| 2018/0143860 A1 | 5/2018 | Dasu et al. |
| 2019/0012116 A1 | 1/2019 | Gutala et al. |
| 2019/0041923 A1 | 2/2019 | Atsatt et al. |
| 2019/0042127 A1* | 2/2019 | Weber ................. G06F 12/0875 |
| 2019/0043536 A1 | 2/2019 | Weber et al. |
| 2019/0044515 A1 | 2/2019 | Gutala et al. |
| 2019/0044519 A1 | 2/2019 | Atsatt et al. |
| 2019/0220566 A1 | 7/2019 | Tang et al. |
| 2020/0119736 A1 | 4/2020 | Weber et al. |
| 2020/0135719 A1* | 4/2020 | Brewer ................. G11C 5/025 |
| 2021/0125657 A1* | 4/2021 | Biswas ............... G11C 11/4023 |

\* cited by examiner

THREE DIMENSIONAL CIRCUIT SYSTEMS AND METHODS HAVING MEMORY HIERARCHIES

FIELD OF THE DISCLOSURE

The present disclosure relates to electronic circuits, and more particularly, to three dimensional circuits and systems having memory hierarchies.

BACKGROUND

A programmable logic integrated circuit (IC), such as a field programmable gate array (FPGA) may include fabric memory circuits (e.g., random access memory and flip-flops) in a core logic region of the IC. The fabric memory circuits may have a low memory capacity, a low memory access latency, and a high memory access bandwidth, because the fabric memory circuits are near programmable logic circuits and digital signal processing circuits in the core logic region. An FPGA typically has accesses to additional memory circuits (referred to as shoreline memory) in the periphery of the FPGA or in other ICs. The shoreline memory (e.g., double date rate memory high-bandwidth memories) may have a high memory capacity, a high memory access latency, and a low memory access bandwidth.

DETAILED DESCRIPTION

Figure 1:
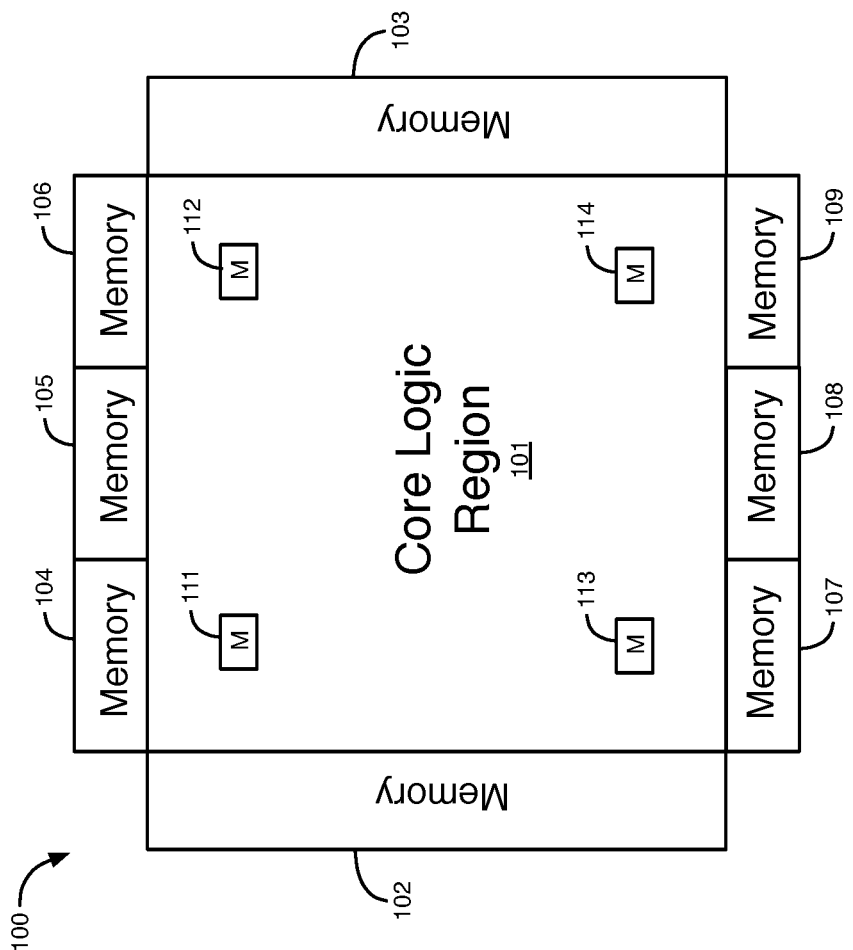
FIG. 1 illustrates an example of a circuit system that includes a main integrated circuit (IC) die having a core logic region with fabric memory circuits and a peripheral region that includes shoreline memory circuits, according to an embodiment.

A circuit system in an integrated circuit (IC) package may include fabric memory circuits in a main integrated circuit die and one or more shoreline memory circuits in additional integrated circuit dies and/or in a peripheral region of the main IC die. FIG. 1 illustrates an example of a circuit system 100 that includes a main IC die having a core logic region 101 with fabric memory circuits and a peripheral region that includes shoreline memory circuits, according to an embodiment. Circuit system 100 of FIG. 1 includes core logic region 101 that includes fabric memory circuits 111-114 and a peripheral region that includes shoreline memory circuits 102-109. 4 fabric memory circuits 111-114 are shown in the core logic region 101 in FIG. 1 merely as an example. Core logic region 101 may, for example, have many more or less fabric memory circuits (e.g., tens, hundreds, or thousands of fabric memory circuits). 8 shoreline memory circuits 102-109 are shown in FIG. 1 merely as an example. Circuit system 100 may have any number of shoreline memory circuits.

The core logic region 101 is in a main integrated circuit (IC) die. The main IC die may be, for example, a programmable logic IC such as an FPGA, a microprocessor IC, a graphics processing unit (GPU), an application specific IC, or another type of IC. One or more of the shoreline memory circuits 102-109 may be in a peripheral region of the main IC die. One or more of the shoreline memory circuits 102-109 may be in one or more separate IC dies that are coupled to the main IC die (e.g., through an IC package, bridge, or interposer). In some embodiments, some of the shoreline memory circuits may be in the main IC die, and other ones of the shoreline memory circuits may be in one or more separate memory IC dies. The core logic region 101 may also include logic circuits that perform logic functions. The logic circuits in the core logic region 101 have access to the fabric memory circuits 111-114 in the core logic region and have access to the shoreline memory circuits 102-109.

However, there may be a memory capacity gap, a latency gap, and a memory bandwidth gap (each of several orders of magnitude) between the shoreline memory (e.g., some types of high-bandwidth memory (HBM)) and the fabric memory (e.g., 20,480 bit programmable fabric memory). Memory capacity and memory access bandwidth can be added to the shoreline memory by adding more instances of memory, such as HBM. However, adding more shoreline memory circuits is expensive and is limited by a bandwidth wall that is characterized by two main components. The first component is the limited perimeter of the main IC die that can accommodate the shoreline memories. The second component is the long physical distance of the connections between the shoreline memories and the fabric memories (e.g., 10 millimeters or more on average). These long physical connections may require significant power usage (e.g., greater than 100 watts or more). The power consumption of the shoreline memory is a combination of the long physical connections and activation (i.e., accessing bits), which adds up to limit the bandwidth wall along with the limited perimeter of the IC die.

Memory capacity can be added to the fabric memory by using larger memory circuits (e.g. having 144 kilobits). Adding larger memory circuits in the core logic region of the main IC die may require reducing the amount of smaller memory circuits in the core logic region. Also, adding larger memory circuits in the core logic region is limited by the capacity of the core logic region, which may be referred to as a capacity wall. The core logic region may contain highly distributed memory circuits that are located among logic circuits, including digital signal processing (DSP) circuits. The logic circuits in the core logic region may perform high bandwidth computations that use memory circuits that are nearby the logic circuits in the core logic region. Given the spatial organization of circuitry in the core logic region, there is a limit to how much more memory circuitry can be added to the core logic region.

Even with standard modifications, the bandwidth wall and the capacity wall still have a 2-3 orders of magnitude gap between the fabric memories and the shoreline memories. According to some embodiments disclosed herein, a three dimensional circuit system includes one or more memory integrated circuit (IC) dies that include memory circuits (referred to herein as aquifer memory) that are coupled to a main IC die in a vertically stacked configuration. The aquifer memory provides additional memory capacity and memory access bandwidth that can overcome the bandwidth wall and the capacity wall discussed above. The aquifer memory may be in the same integrated circuit (IC) package as the main IC die and one or more of the shoreline memories that are in separate IC dies. The aquifer memory provides additional memory capacity and memory access bandwidth for the logic functions performed on the main IC die. The aquifer memory may include one or multiple integrated circuit (IC) dies coupled to the main IC die.

Throughout the specification, and in the claims, the term "connected" means a direct electrical connection between the circuits that are connected, without any intermediary devices. The term "coupled" means either a direct electrical connection between circuits or an indirect electrical connection through one or more passive or active intermediary devices. The term "circuit" may mean one or more passive and/or active electrical components that are arranged to cooperate with one another to provide a desired function.

Figure 2:
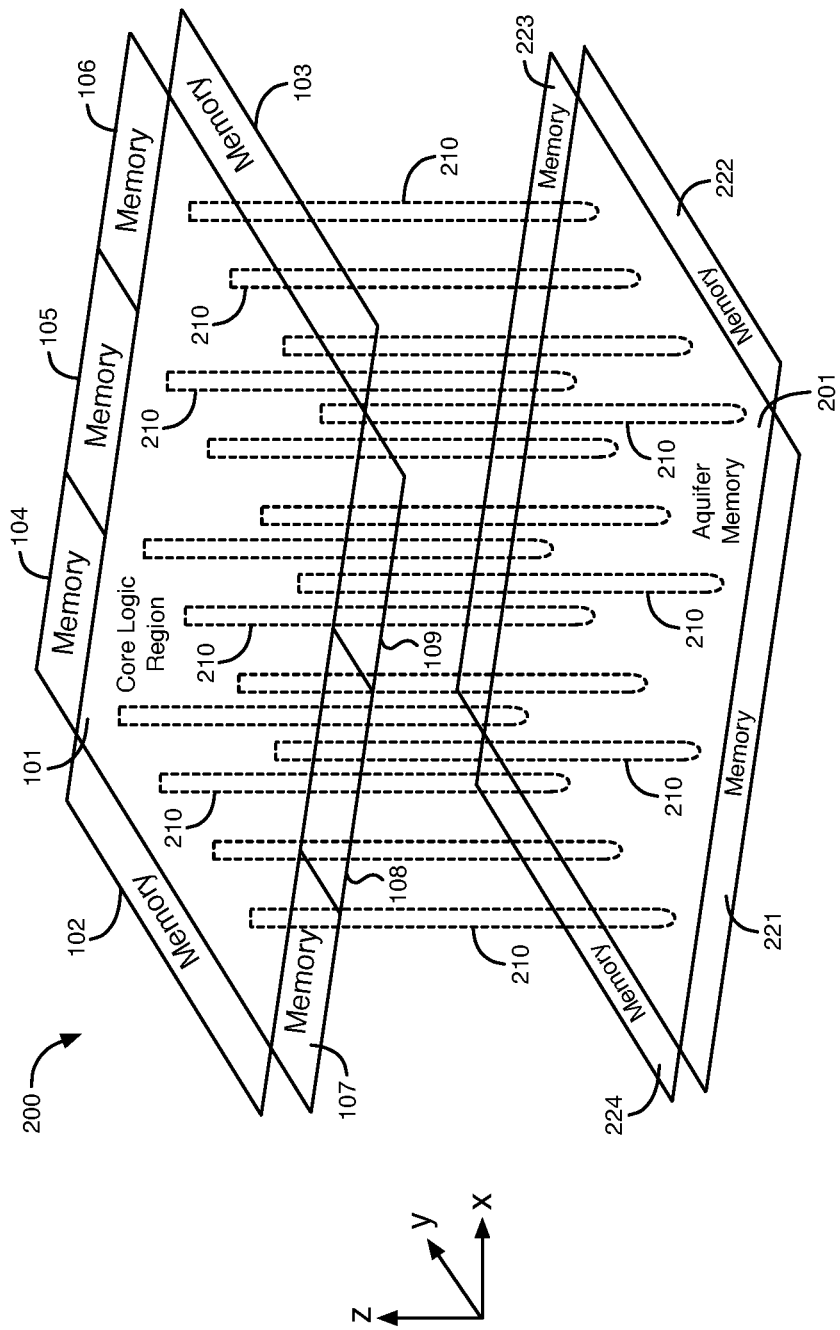
FIG. 2 illustrates an example of a circuit system that includes a core logic region with fabric memory circuits in a main integrated circuit (IC) die, a peripheral region that includes shoreline memory circuits, and a vertically stacked memory IC die that includes aquifer memory, according to an embodiment.

FIG. 2 illustrates an example of a three dimensional (3D) circuit system 200 that includes a core logic region 101 with fabric memory circuits in a main integrated circuit (IC) die, a peripheral region around the main IC die that includes shoreline memory circuits 102-109, aquifer memory 201, and a peripheral region around aquifer memory 201 that includes shoreline memory circuits 221-224, according to an embodiment. Aquifer memory 201 may include one or multiple integrated circuit (IC) dies. The core logic region 101 and the shoreline memory circuits 102-109 of FIG. 2 are also shown in FIG. 1. Thus, core logic region 101 includes fabric memory circuits, such as fabric memory circuits 111-114, which are not shown in FIG. 2. The length and width of the main IC die lie in a plane along the x and y axes shown in FIG. 2. The length and width of the shoreline memory circuits 102-109 lie in the same plane as the main IC die along the x and y axes. The length and width of the aquifer memory 201 lie in a plane along the x and y axes that is parallel to the plane of the main IC die. If the aquifer memory 201 includes multiple IC dies, the IC dies lie in the same plane along the x and y axes and may, for example, be coupled together through a package substrate, interconnection bridge, or interposer. The length and width of the shoreline memory circuits 221-224 lie in the same plane as the aquifer memory 201 along the x and y axes.

The aquifer memory 201 and the main IC die are coupled together in a vertically stack configuration. In the embodiment of FIG. 2, the aquifer memory 201 is underneath the main IC die. In other embodiments, the aquifer memory 201 may be above the main IC die. The aquifer memory 201 is coupled to the core logic region 101 in the main IC die through direct conductive die-to-die connections 210. Direct die-to-die connections 210 are parallel to the z axis shown in FIG. 2 and are perpendicular to the plane of the main IC die. 16 direct die-to-die connections 210 are shown in FIG. 2 merely as an example. Circuit system 200 may include more or less of the direct die-to-die connections 210 than the 16 connections 210 shown in FIG. 2. Direct die-to-die connections 210 may include, for example, connections in the main IC die and the aquifer memory 201 (such as through silicon vias) and connections that connect the main IC die to the aquifer memory 201, such as conductive bumps, hybrid-bonding connections, magnetic coupling connections, or thermo-compression bonding connections.

The shoreline memory circuits 221-224 may, for example, be in a peripheral region of a single IC die that includes the aquifer memory 201. Alternatively, the shoreline memory circuits 221-224 may be in 4 or more IC dies that are separate from the one or more IC dies that contain the aquifer memory 201. Each of the shoreline memory circuits 221-224 may, for example, include one or more IC dies. The shoreline memory circuits 221-224 are located around a periphery of aquifer memory 201.

In some embodiments, the aquifer memory 201 may have memory capacity that is greater than the memory capacity of the fabric memories and less than the memory capacity of the shoreline memories, such as shoreline memories 102-109 and 221-224. The aquifer memory 201 may have memory access bandwidth that is less than the memory access bandwidth of the fabric memory and greater than the memory access bandwidth of the shoreline memories 102-109 and 221-224. As a result, the memory capacity and memory access bandwidth of the aquifer memory 201 can break through the bandwidth wall and the capacity wall. Because the aquifer memory is coupled to the main IC die in a vertically stacked configuration, the aquifer memory can provide a higher memory access bandwidth than the shoreline memory, which may allow the circuit system to move beyond the bandwidth wall. The aquifer memory 201 has a large die area (e.g., equivalent to the die size of the main IC die) that accommodates a large number of memory circuits. The memory circuits in the aquifer memory 201 may provide enough memory capacity to move beyond the capacity wall.

According to some embodiments disclosed herein, a three dimensional (3D) memory subsystem for an electronic circuit system is composed of three classes of memory that together enable a high memory capacity, high memory access bandwidth, low latency, and energy efficient memory hierarchy for spatial compute in the main IC die. Spatial compute may refer to computations performed by a group of logic circuits in the same area of the core logic region of the main IC die that rely on accessing memory circuits to perform the computations. The first class of memory includes the shoreline memory circuits, such as memory circuits 102-109 and 221-224, that reside in the periphery of the main IC die, in other IC dies that are adjacent to and lie in the same plane as the length and width of the main IC die, in the periphery of an IC die containing the aquifer memory 201, and/or in other IC dies that are adjacent to and lie in the same plane as the length and width of the aquifer memory 201, as shown in FIGS. 1-2. The first class of memory may have a higher memory capacity, a higher memory access latency, and a lower memory access bandwidth (e.g., Optane™ memory by Intel® Corporation, double date rate (DDR) memory, and high-bandwidth memory (HBM)) than the second and third classes of memory. The second class of memory includes memory circuits in one or more memory integrated circuit (IC) dies, referred to as the aquifer memory, that are on top of or underneath the main IC die in a vertically stacked arrangement. The aquifer memory is coupled to the main IC die through direct connections. The aquifer memory in the second class may have a medium memory capacity, medium memory latency, and medium memory access bandwidth that are in between the first class of memory and the third class of memory. The third class of memory includes the fabric memory circuits, such as memory circuits 111-114, that reside in the core logic region 101 of the main IC die. The third class of memory circuits may have a lower memory capacity, a lower memory access latency, and a higher memory access bandwidth (e.g., random access memory, memory circuits in logic array blocks, and flip-flops in arithmetic logic modules) than the first and second classes of memory. The third class of memory circuits are located near logic circuitry in the core logic region 101 of the main IC die that performs spatial compute, such as programmable logic circuits and digital signal processing (DSP) circuits.

According to some embodiments, methods and apparatuses are provided for a memory hierarchy having three classes of memories that may improve the power and performance of memory bound spatial compute by optimizing the physical distance between the memory circuits and the spatial compute in the main IC die. The three classes of memories in the memory hierarchy may include the shoreline memory, the aquifer memory, and the fabric memory. In addition, each of the three classes of memories may have an internal memory hierarchy within each class. The memory hierarchy may also optimize the memory capacity, memory access bandwidth, and latency of the memory circuits in the circuit system. The memory hierarchy within the three classes and across the three classes may be organized so that each memory circuit is closer to the spatial compute occurring in the core logic region of the main IC die. The memory hierarchy can improve the power and performance of the spatial compute. Methods and apparatuses are also provided that enable the memory hierarchy and the spatial compute through direct replacement of intellectual property functions in the core logic region of the main IC die.

In the memory hierarchy, memory contents may be moved to the smaller and faster memories that are closer to the spatial compute occurring in the core logic region of the main IC die, while using the slower and larger memories in the hierarchy for capacity expansion. In some embodiments, a memory caching architecture is used in the memory hierarchy. In some embodiments, the movement of data between the three classes of memory in the memory hierarchy is controlled by software. In some embodiments, the movement of data in the memory hierarchy is orchestrated by programmable logic circuitry in the core logic region.

Figure 3:
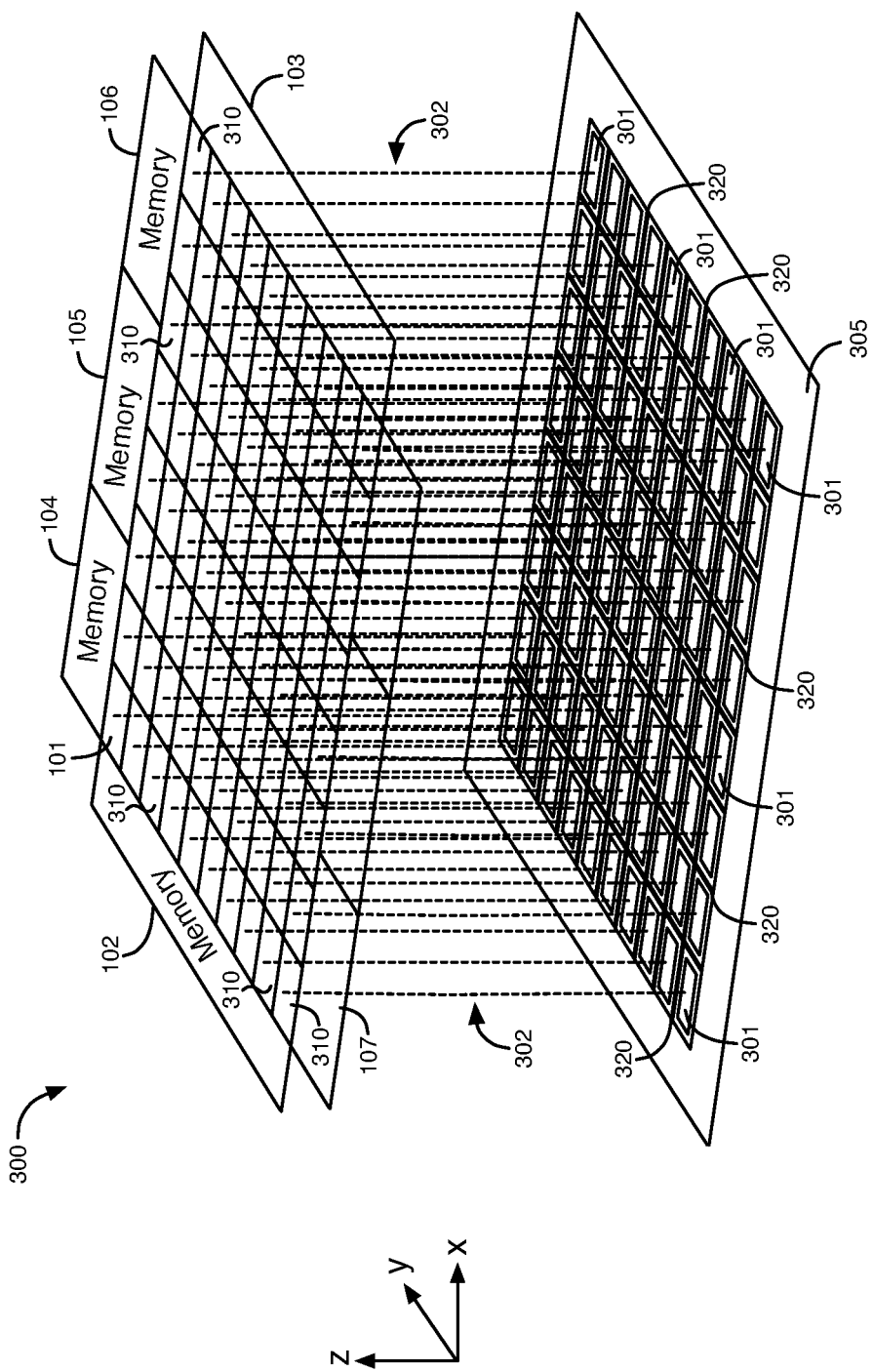
FIG. 3 illustrates an example of a circuit system that includes a core logic region with fabric memory circuits in a main integrated circuit (IC) die, a peripheral region that includes shoreline memory circuits, and a vertically stacked memory IC die that includes memory circuits organized into sectors, according to an embodiment.

FIG. 3 illustrates an example of a 3D circuit system 300 that includes a core logic region 101 with fabric memory circuits in a main integrated circuit (IC) die, a peripheral region that includes shoreline memory circuits 102-109, and a memory IC die 305 that includes memory circuits 301 that are organized into sectors, according to an embodiment. Memory IC die 305 is an example of the aquifer memory 201. FIG. 3 illustrates further details of examples of the main IC die of FIGS. 1-2 and the memory IC die 305. In the embodiment of FIG. 3, the core logic region 101 of the main IC die includes 80 logic sectors that are arranged into 10 rows and 8 columns. 80 logic sectors arranged in 10 rows and 8 columns are shown merely as an example. In other embodiments, core logic region 101 may have any number of rows and columns of logic sectors. Each of the logic sectors may include, for example, logic circuits (e.g., programmable logic circuits such as combinatorial logic circuits and sequential logic circuits, digital signal processing circuits, etc.) and fabric memory circuits.

In the embodiment of FIG. 3, the aquifer memory in memory IC die 305 is in memory circuits 301. The memory circuits 301 are organized into 10 rows and 8 columns in IC die 305 in the example of FIG. 3, for a total of 80 memory circuits 301. Although, memory IC die 305 may have any number of memory circuits 301, and core logic region 101 may have any number of logic sectors 310. The memory circuits 301 in memory IC die 305 are aligned along the z axis with the logic sectors 310 in the core logic region 101 of the main IC die, as shown in FIG. 3, such that each of the memory circuits 301 is directly underneath and aligned with a corresponding one of the logic sectors 310. The memory circuits 301 are coupled to the logic sectors 310 through 80 conductive direct die-to-die connections 302, which are shown as dotted lines in FIG. 3. Direct die-to-die connections 302 are parallel to the z axis shown in FIG. 3. Each of the memory circuits 301 in the memory IC die 305 is coupled to and in communication with the corresponding one of the logic sectors 310 through one of the direct die-to-die connections 302. Direct die-to-die connections 302 may include, for example, connections in the main IC die and the memory IC die 305 (e.g., through silicon vias), conductive pads on the surfaces of the main IC die and memory IC die 305, and conductive connections that connect the conductive pads on the main IC die to the conductive pads on the memory IC die 305. With the embodiment of FIG. 3, the main IC die can be designed or retro-fitted to use with the aquifer memory in memory IC die 305. In some embodiments, two or more of the memory circuits 301 can communicate with each other through a network-on-chip (NOC) 320 (e.g., one or more conductive wires or busses between the rows and columns of memory circuits 301) in the memory IC die 305. The NOC 320 can couple the memory circuits 301 in IC die 305 together. The NOC 320 allows the logic sectors 310 in the main IC die to access the aquifer memory in memory circuits 301 that are not directly below the accessing logic sectors 310.

Figure 4:
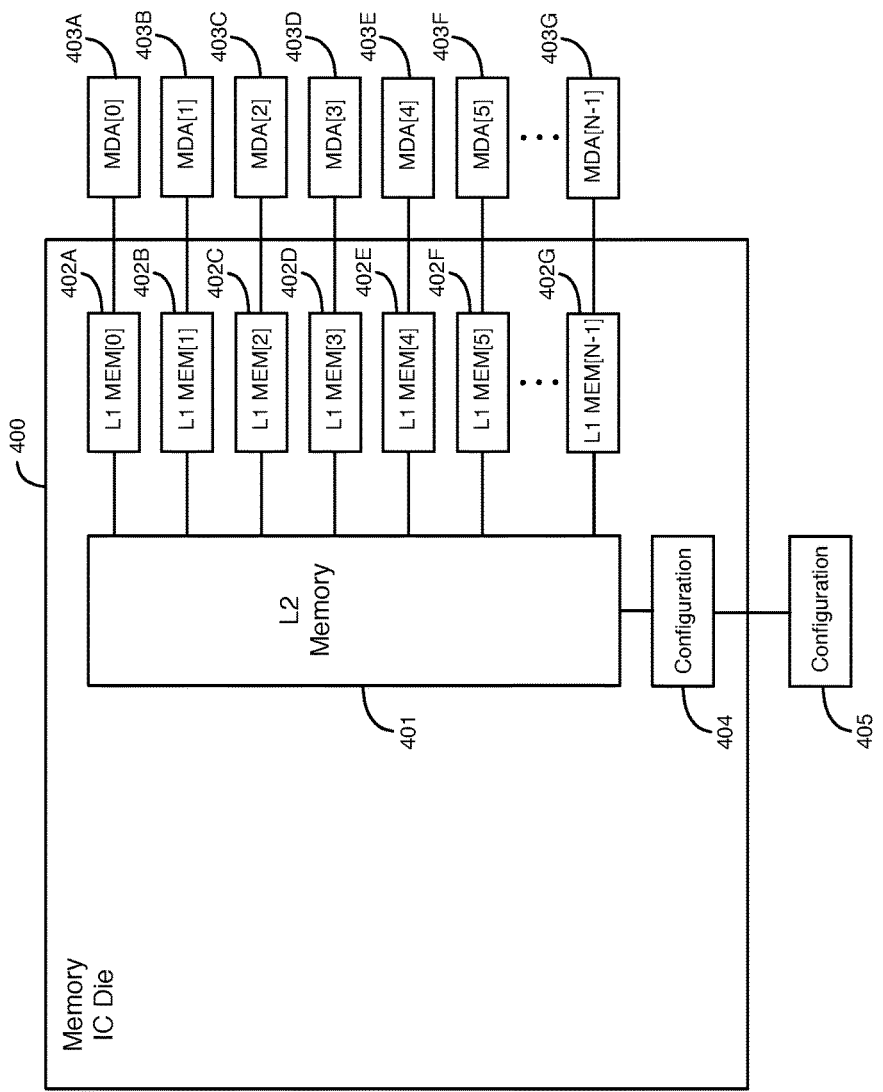
FIG. 4 illustrates an example of a memory IC die containing aquifer memory circuits that are coupled to logic sectors in the main IC die, according to another embodiment.

FIG. 4 illustrates an example of a memory IC die 400 containing aquifer memory circuits that are coupled to logic sectors in the main IC die, according to another embodiment. Memory IC die 400 is an example of the aquifer memory 201 of FIG. 2. In the embodiment of FIG. 4, memory IC die 400 includes aquifer memory in 2 levels (L1 and L2) of memory circuits. The memory circuits 402A-402G in the first level (L1) of aquifer memory in the memory IC die 400 are directly coupled to memory direct access (MDA) circuits 403A-403G, respectively, in corresponding logic sectors 310 of the main IC die. Although 7 L1 memory circuits 402A-402G are shown in FIG. 4 as an example, memory IC die 400 may have any number of L1 memory circuits. Each of the logic sectors 310 in the main IC die can only access the L1 memory circuit 402 that is directly below that logic sector 310 through its MDA circuit 403, as shown in FIG. 4, because memory IC die 400 does not contain a NOC that is coupled to the memory circuits. In some embodiments, the logic sectors 310 may have an N number of ports that are aligned to N corresponding memory circuits 402 in the aquifer memory (i.e., 0 through N-1).

The memory circuit 401 in the second level (L2) of aquifer memory in the memory IC die 400 is coupled to each of the memory circuits 402A-402G in the first level (L1), as shown in FIG. 4. In some embodiments, the L2 memory circuit 401 is partitioned so that each of the L1 memory circuits 402A-402G has private access to one of the partitions in the L2 memory circuit 401. Access to the partitions in the memory circuit 401 is controlled by static or dynamic configuration in configuration controller circuit 404 in memory IC die 400 and/or configuration controller circuit 405 outside IC die 400. Configuration controller 404 is coupled to memory circuit 401, and configuration controller 405 is coupled to configuration controller circuit 404. The L2 memory circuit 401 is addressable, and each of the L1 memory circuits 402A-402G may contain a sub-portion of L2 memory circuit 401.

Figure 5:
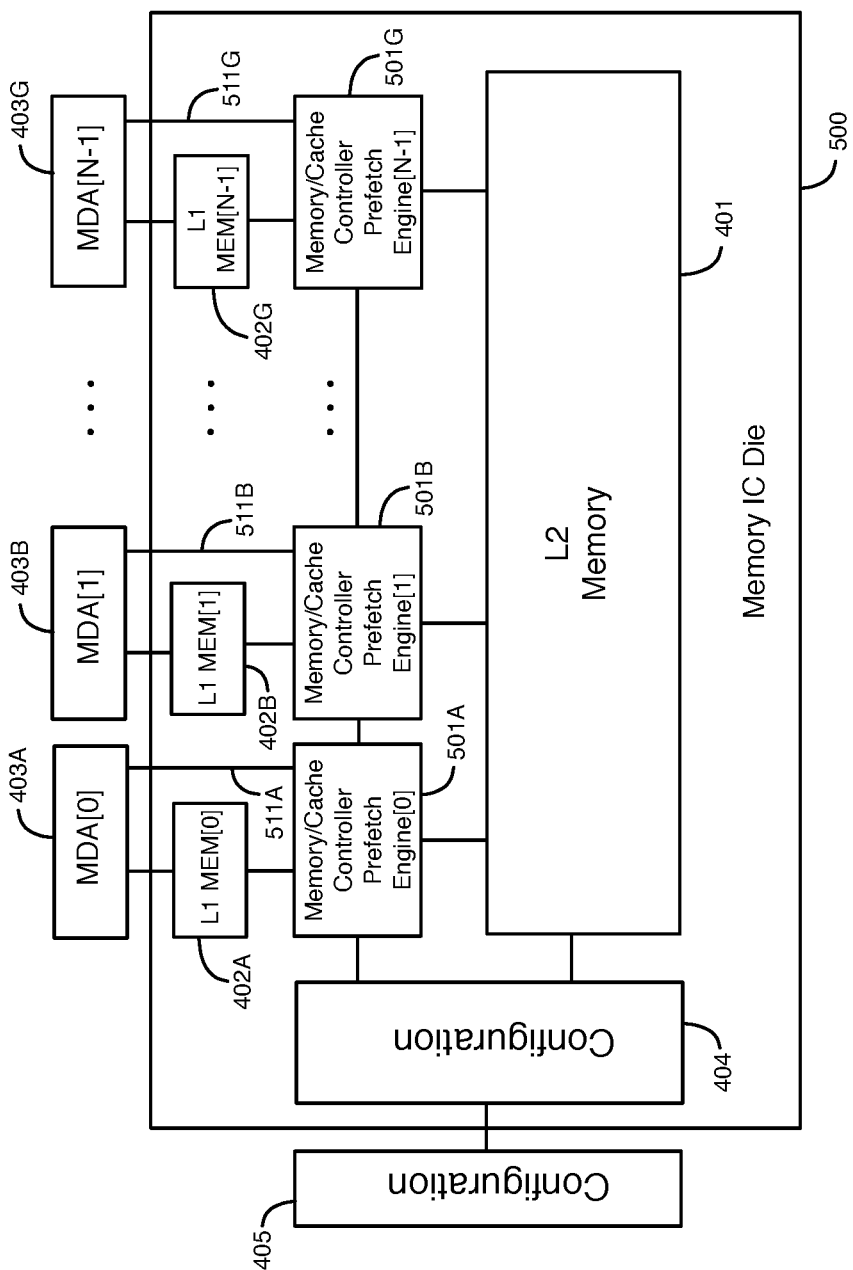
FIG. 5 illustrates an example of a memory IC die containing cache controller prefetch circuits that are coupled between two different levels of memory circuits in the aquifer memory, according to another embodiment.

FIG. 5 illustrates an example of a memory IC die 500 containing cache controller prefetch circuits that are coupled between two different levels of memory circuits in the aquifer memory, according to another embodiment. Memory IC die 500 is an example of the aquifer memory 201 of FIG. 2. In the embodiment of FIG. 5, memory IC die 500 includes first level (L1) memory circuits 402A-402G, second level (L2) memory circuit 401, and the configuration controller 404 that are disclosed herein with respect to FIG. 4. IC die 500 also includes an N number of memory/cache controller prefetch engine circuits [0]-[N-1] 501A-501G. The memory/cache controller prefetch engine circuits 501A-501G are interfaces between the MDA circuits 403A-403G in the logic sectors 310 of the main IC die and the aquifer memory in memory circuits 401-402. MDA circuits 403A-403G are coupled directly to the memory/cache controller prefetch engine circuits 501A-501G through inter-die connections 511A-511G, respectively, bypassing memory circuits 402A-402G. Connections 511A-511G may, for example, include connections in the main IC die and the memory IC die 500, conductive pads on the surfaces of the main IC die and memory IC die 500, and conductive connections that connect the conductive pads on the main IC die to the conductive pads on the memory IC die 500. In some embodiments, memory/cache controller prefetch engine circuits 501A-501G may be controlled by the MDA circuits 403A-403G in the logic sectors 310 of the main IC die via inter-die connections 511A-511G, respectively.

As mentioned above, each of the three classes of memories (i.e., shoreline, aquifer, and fabric memories) may have internal memory hierarchies. For example, the shoreline memory may include Optane™, DDR, and HBM memory; the aquifer memory may include L1 memory circuits 402 and L2 memory circuit 401; and the fabric memory may include 144 kilobit memory, 20 kilobit memory, memory in logic array blocks (LABs), and flip-flops in arithmetic logic modules (ALMs).

The MDA circuits 403A-403G may cause the memory/cache controller prefetch engine circuits 501A-501G to pre-fetch data stored in one of the two levels of memory circuits 401 or 402A-402G and transfer the pre-fetched data to the other level of memory circuits 401 or 402A-402G or to MDA circuits 403A-403G. In some embodiments, the L2 memory circuit 401 is partitioned into private memory partitions that are accessible by the corresponding L1 memory circuits 402A-402G under the control of the respective MDA circuits 403A-403G. In some embodiments, the L2 memory circuit 401 allows any of the L1 memory circuits 402A-402G to access its memory partitions. In these embodiments, cache coherency mechanisms are employed between the partitions of the memory circuit 401 using memory/cache controller prefetch engine circuits 501A-501G. In some embodiments, memory IC die 500 has a hierarchy of more than two levels of memory circuits in the aquifer memory. In these embodiments, the movement of data between the three or more levels of the memory circuits in the aquifer memory is controlled by a cache architecture, software, and/or programmable logic circuits in the main IC die. In some embodiments, the memory hierarchy within the aquifer memory may include three or more levels of memory circuits (i.e., L1, L2, L3, etc.).

Figure 6:
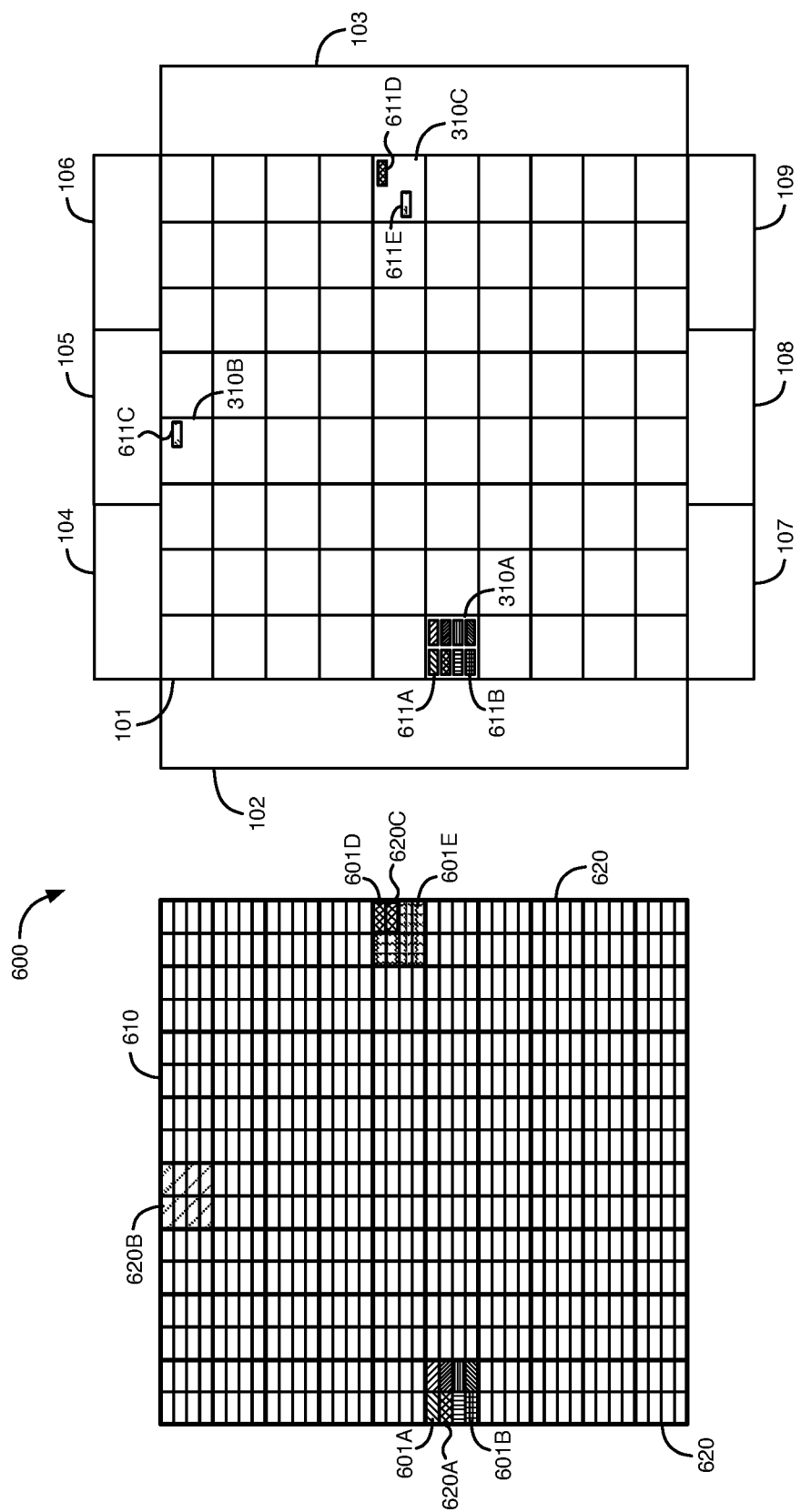
FIG. 6 illustrates an example of a circuit system that includes a core logic region having memory direct access circuits that can access the aquifer memory in the memory IC die, according to an embodiment.

FIG. 6 illustrates an example of a circuit system 600 that includes a core logic region 101 with fabric memory circuits in a main integrated circuit (IC) die, a peripheral region that includes shoreline memory circuits 102-109, and a memory IC die 610 that includes memory circuits organized into sectors 620, according to an embodiment. Memory IC die 610 is an example of the aquifer memory 201 of FIG. 2. Memory IC die 610 is coupled to the main IC die in a vertically stacked configuration. In the example of FIG. 6, memory IC die 610 includes 80 sectors 620 of memory circuits that are arranged in 8 columns and 10 rows. However, memory IC die 610 may include any number of memory circuit sectors. Each of the 80 sectors 620 of memory circuits in the memory IC die 610 includes 8 L1 memory circuits in the aquifer memory and an L2 memory circuit in the aquifer memory. Each of the L1 memory circuits in each of the sectors 620 is coupled to a memory direct access (MDA) circuit in one of the sectors 310 in the core logic region 101 of the main IC die, as disclosed herein for example with respect to FIG. 5. Each of the sectors 310 of logic circuits in the core logic region 101 may include one or more of the MDA circuits. In some embodiments, each of the sectors 310 of logic circuits may include 8 of the MDA circuits.

FIG. 6 shows 11 of the MDA circuits in the core logic region 101 as illustrative examples, including MDA circuits 611A-611E. Each of the MDA circuits in the core logic region 101 has access to an L1 memory circuit in the aquifer memory of the memory IC die 610 and one or more partitions of an L2 memory circuit in the aquifer memory of the memory IC die 610. As an example, sector 310A in core logic region 101 has 8 MDA circuits. Each of the 8 MDA circuits in sector 310A has direct access to one of the 8 private partitions of the L2 memory circuit in sector 620A in memory IC die 610 that is directly below the accessing MDA circuit. As a more specific example, MDA circuits 611A and 611B in sector 310A have direct access to the private partitions 601A and 601B, respectively, of the L2 memory circuit in sector 620A. As another example, MDA circuit 611C in sector 310B in the core logic region 101 has access to each of the 8 partitions of the L2 memory circuit in sector 620B of memory IC die 610. As yet another example, MDA circuit 611D in sector 310C in the core logic region 101 has access to 2 partitions 601D of the L2 memory circuit in sector 620C of memory IC die 610, and MDA circuit 611E in sector 310C has access to 6 partitions 601E of the L2 memory circuit in sector 620C. In some embodiments, the MDA circuits may allow the fabric memory circuits, logic circuits, and DSP circuits in the core logic region 101 to access one or more private partitions of the L2 memory circuits in the aquifer memory of memory IC die 610. In some embodiments, the number of partitions of an L2 memory circuit may be greater than the number of accessing MDA circuits. For example, if there are 8 MDA circuits in a sector, the L2 memory circuit may have 32 partitions that are accessible by the 8 MDA circuits as the configuration directs.

Figure 7:
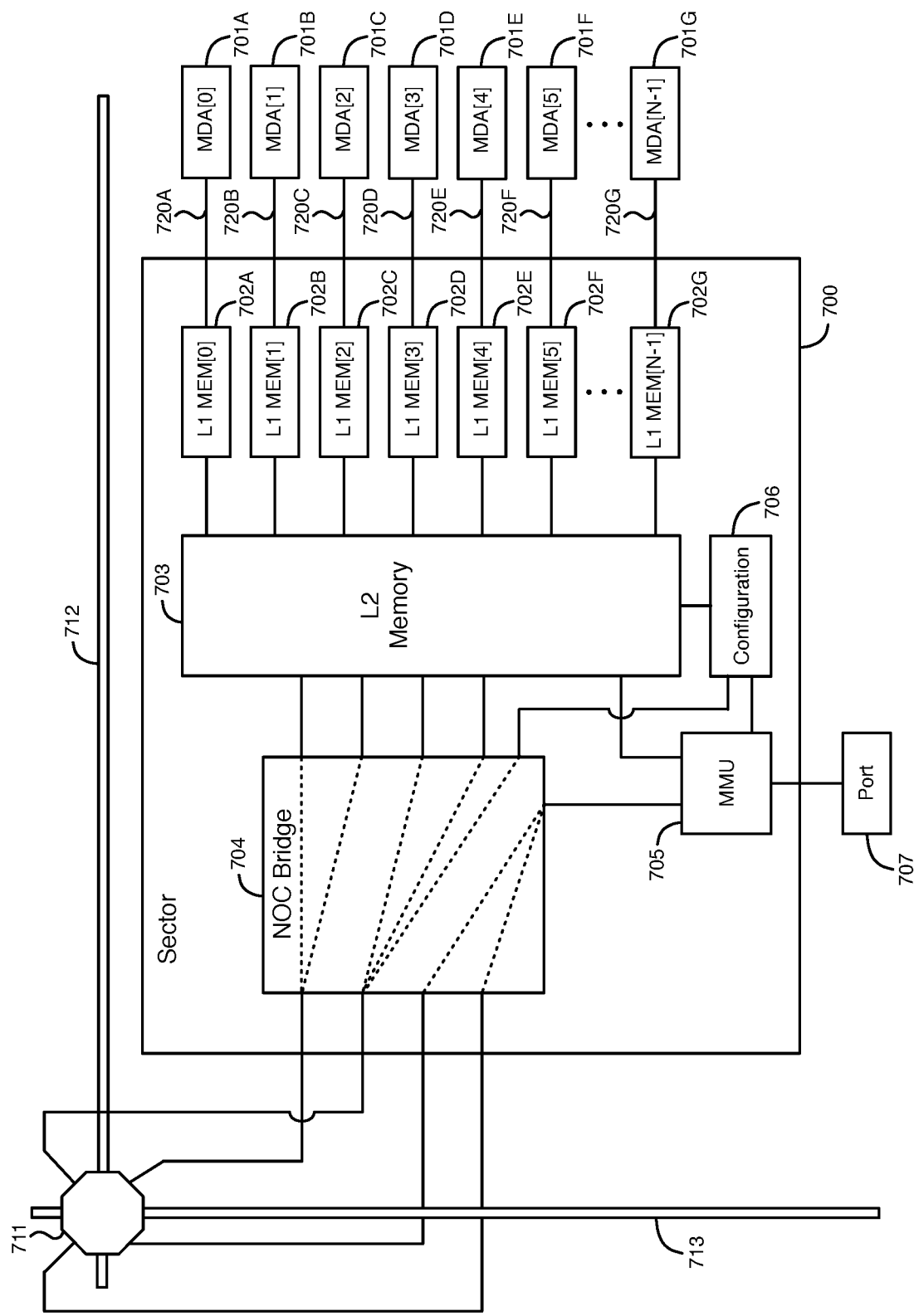
FIG. 7 illustrates an example of a sector having aquifer memory and a network-on-chip (NOC) in a memory IC die, according to an embodiment.

FIG. 7 illustrates an example of a sector 700 having aquifer memory and a network-on-chip (NOC) in a memory IC die, according to an embodiment. Sector 700 and the NOC of FIG. 7 are in a memory IC die such as IC die 305, IC die 610, or a memory IC die in aquifer memory 201. The NOC of FIG. 7 includes router circuit 711 and horizontal and vertical conductive wires or buses 712-713. Sector 700 includes an N number of L1 memory circuits 702A-702G, L2 memory circuit 703, NOC bridge circuit 704, memory mapping unit (MMU) circuit 705, and configuration circuit 706. The memory IC die is coupled to a main IC die through die-to-die connections 720 that lie along the z axis. The main IC die includes an N number of memory direct access (MDA) circuits 701A-701G and ports 707. The main IC die may have one or more ports 707. Each of the ports 707 is coupled to an MMU circuit 705 in a different sector 700 having aquifer memory. MDA circuits 701A-701G are coupled to, and have direct access to, L1 memory circuits 702A-702G through die-to-die connections 720A-720G, respectively. L1 memory circuits 702A-702G are coupled to terminals of L2 memory circuit 703. MDA circuits 701A-701G and L1 memory circuits 702A-702G have access to private partitions of L2 memory circuit 703, as discussed above.

L2 memory circuit 703 has access to the L1 and L2 memory circuits in any of the other sectors of the aquifer memory in the memory IC die through the NOC. For example, in the embodiment of FIG. 3, any of the memory circuits 301 in one of the sectors in memory IC die 305 may have access to the memory circuits in any of the other sectors of memory circuits 301 in the memory IC die 305 through NOC 320, such as the NOC shown in FIG. 7. The NOC bridge circuit 704 can couple the L2 memory circuit 703 to the router 711 in the NOC, as shown in FIG. 7. The dotted lines in the NOC bridge 704 are examples of the connections between router 711 and the circuitry in sector 700. Sector 700 can transfer data between the memory circuit 703 and other sectors of memory circuits in the memory IC die through NOC bridge 704, router 711, and conductive wires and buses in the NOC, such as conductive wires/buses 712-713. The NOC is coupled to each of the other sectors of memory circuits in the memory IC die, as shown, for example, in FIG. 3.

The main IC die in the embodiment of FIG. 7 includes one or more ports 707 that provide access to the memory circuits 702-703 in sector 700 via the MMUs 705. There may be a 1:1 association between each port 707 and each MMU 705. In some embodiments, the aquifer memory in the memory IC die has one physical address space. The MMU circuit 705 allows a user to define a circuit design assuming a logical address space for the circuit design that is implemented in the aquifer memory in the memory IC die. In some embodiments, memory mapping unit (MMU) circuit 705 provides logical-to-physical address translation and access control for accesses by the circuit design in core logic region 101 of the main IC die to the aquifer memory including memory circuits 702-703 via port 707. The MMU circuit 705 also provides security to disallow unauthorized access to the aquifer memory in the memory IC die by circuitry in the core logic region 101, including disallowing unauthorized access to memory circuits 702-703. In some embodiments, the NOC of FIG. 7 allows sectors of logic circuits in the core logic region 101 to access data in sectors of the aquifer memory in the memory IC die that are not directly below the sectors in the core logic region 101 that accessed the data, subject to the restrictions of the MMU circuit 705, such as security rules. These embodiments obviate the need to transport data between sectors in the core logic region 101 that has been accessed from sectors in the memory IC die that are not directly below the sector in the core logic region 101 that accessed the data.

Figure 8:
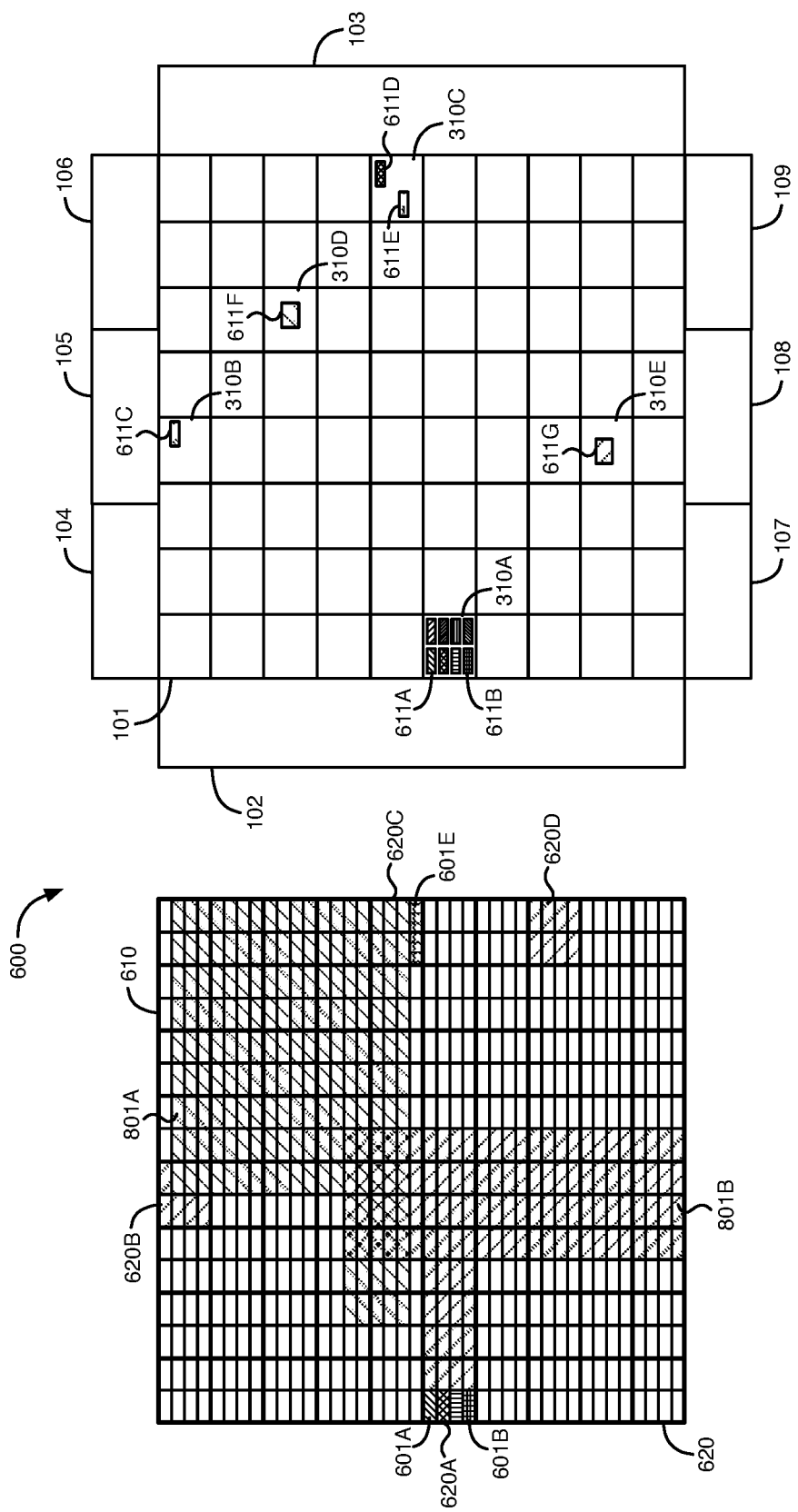
FIG. 8 illustrates the exemplary circuit system of FIG. 6 having accessor circuits that are mapped to physical address spaces in the memory IC die, according to an embodiment.

FIG. 8 illustrates the exemplary circuit system 600 of FIG. 6 having accessor circuits that are mapped to physical address spaces in the memory IC die 610, according to an embodiment. The accessor circuits may be Advanced Extensible Interface (AXI) circuits or any type of memory mapping interface circuits. FIG. 8 shows 11 of the MDA circuits in the core logic region 101 as illustrative examples, including MDA circuits 611A-611E. Each of the MDA circuits in the core logic region 101 has access to an L1 memory circuit in the aquifer memory of the memory IC die 610 and one or more partitions of an L2 memory circuit in the aquifer memory of the memory IC die 610. Each of the MDA circuits may have access to L1 memory circuits and/or L2 memory circuits in two or more of the sectors 620 of memory IC die 610 (e.g., through a NOC).

In some embodiments, the accessor circuits in the main IC die have access to the memory circuits in memory IC die 610. In these embodiments, a software compiler maps the MDA circuits and accessor circuits with corresponding fabric memories, logic circuits, and DSPs in the core logic region 101. Each MDA circuit is allocated a private partition of the L2 memory in the vertically aligned aquifer memory in the memory IC die 610. Each MDA circuit may be allocated to a portion of the physical address space in the aquifer memory of the memory IC die 610. Each accessor circuit may be allocated to a portion of the physical address space in the aquifer memory of the memory IC die 610. In some embodiments, the physical address space allocated to one accessor circuit overlaps with the physical address space allocated to another accessor circuit. In some embodiments, the physical address space allocated to an accessor circuit overlaps with the physical address space allocated to an MDA circuit. In some embodiments, an accessor circuit has source address translation and access restrictions implemented by the MMU circuit 705 coupled to the accessor circuit.

As an example, sector 310D in core logic region 101 includes accessor circuit 611F. Accessor circuit 611F is allocated to the physical address space of the L1 and/or L2 memory circuits (of the aquifer memory) in a region 801A of memory IC die 610 that includes 12 whole sectors 620 and portions of 17 additional sectors 620, including portions of sectors 620B and 620C. The physical address space allocated to accessor circuit 611F overlaps with the physical address space allocated to MDA circuits 611C-611E in portions of sectors 620B-620C. Region 801A of memory IC die 610 is illustrated by diagonal lines that slope down to the right in FIG. 8.

As another example, FIG. 8 shows an accessor circuit 611G in sector 310E of the core logic region 101 of the main IC die. Accessor circuit 611G is allocated to the physical address space of the L1 and/or L2 memory circuits (of the aquifer memory) in a region 801B of memory IC die 610 that includes 8 whole sectors 620 and portions of 15 additional sectors 620. The physical address space allocated to accessor circuit 611G also includes the L1/L2 aquifer memory in a sector 620D that is not adjacent to region 801B. Sector 620D and region 801B of memory IC die 610 are illustrated by diagonal lines that are orthogonal to the diagonal lines of region 801A in FIG. 8. The physical address space allocated to accessor circuit 611G in region 801B overlaps with the physical address space allocated to accessor circuit 611F in region 801A, as shown by the cross hatching in FIG. 8. The physical address space allocated to accessor circuit 611G in region 801B also overlaps with the physical address spaces allocated to 4 MDA circuits in a portion of sector 620A.

Figure 9:
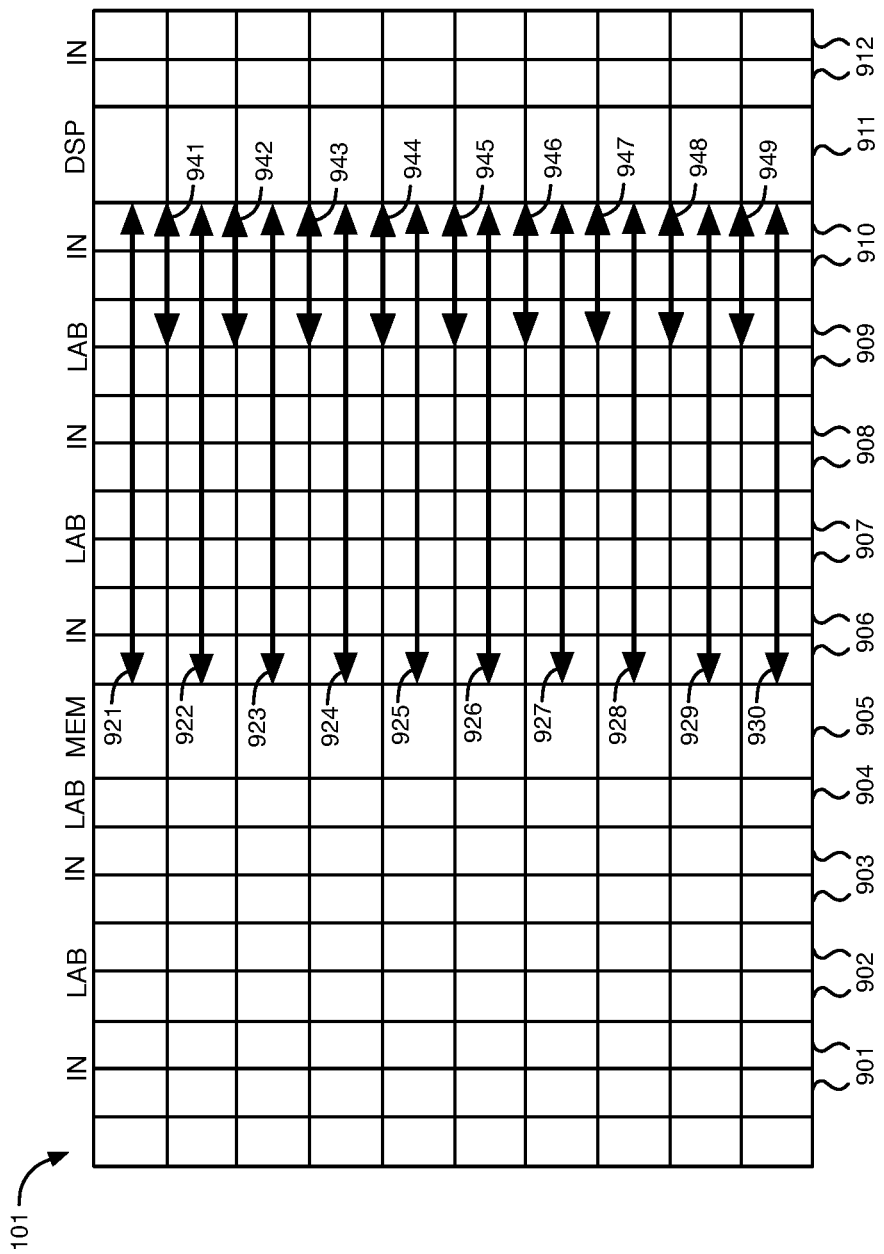
FIG. 9 illustrates an example of the core logic region of the main IC die having memory, logic, interconnections, and digital signal processing circuits, according to an embodiment.

FIG. 9 illustrates an example of the core logic region 101 of the main IC die having memory, logic, interconnections, and digital signal processing circuits, according to an embodiment. In the embodiment of FIG. 9, the main IC die is a programmable logic integrated circuit (IC), such as a field programmable gate array (FPGA). In the embodiment of FIG. 9, the core logic region 101 includes interconnections (IN) (including wires and interconnection circuits) that are located in columns 901, 903, 906, 908, 910, and 912. The core logic region 101 includes programmable logic circuits and memory circuits in logic array blocks (LABs) that are located in columns 902, 904, 907, and 909. The LABs may also include one or more arithmetic logic modules (ALMs). The ALMs may, for example, contain programmable lookup-table circuits and flip-flops. The core logic region 101 also includes fabric memory (MEM) circuits that are located in column 905 and digital signal processing (DSP) circuits that are located in column 911. Thus, the fabric memory and DSP circuits are in separate columns outside the LABs in core logic region 101. The interconnections in columns 901, 903, 906, 908, 910, and 912 may be programmed to couple together selected ones of the logic array blocks (LABs), digital signal processing (DSP) circuits, and fabric memory circuits in the columns shown in FIG. 9.

Core logic region 101 provides compute-near-memory capabilities, as shown in FIG. 9, where the DSP circuits in column 911 are located near the fabric memory circuits in column 905 and the memory in the LABs in column 909. Core logic region 101 also includes interconnections 921-930 and 941-949, which are illustrated as bi-directional arrows in FIG. 9. Interconnections 921-930 and 941-949 may be implemented as short vertical and/or horizontal wires. Interconnections 921-930 and 941-949 may be programmable or non-programmable. Interconnections 921-930 may be programmed to couple one or more of the DSP circuits in column 911 to one or more of the fabric memory circuits in column 905 so that data may be transferred between the circuits in these columns via one or more of the interconnections 921-930. Interconnections 941-949 may be programmed to couple one or more of the DSP circuits in column 911 to memory circuits in one or more of the logic array blocks (LABs) in column 909 so that data may be transferred between the circuits in these columns via one or more of the interconnections 941-949. Also, the fabric memory circuits in column 905 and the memory circuits (including the flip-flops) in the logic array blocks (LABs) in columns 902, 904, 907, and 909 are near the logic circuits in the LABs. The distributed nature of the memory circuits and the computational logic circuits in the core logic region 101 of the programmable logic IC provides high bandwidth and low latency connections to the fabric memory circuits in column 905. However, the capacity of the fabric memory circuits is limited.

In some embodiments, the programmable logic IC containing the core logic region 101 of FIG. 9 provides specialized compute-near-memory capabilities, such that the DSP circuits in column 911 are specialized DSP circuits. In these embodiments, one or more of the specialized DSP circuits in column 911 are designed and/or configured for the computation of artificial intelligence (AI) and machine learning algorithms, such as artificial neural networks. In some embodiments, the specialized DSP circuits in column 911 that are designed and/or configured for the computation of AI and machine learning algorithms may be memory bound and require a larger amount of memory. The specialized DSP circuits in column 911 may access the fabric memory circuits in column 905 through interconnections 921-930. The specialized DSP circuits in column 911 may access the memory circuits in the LABs in column 909 through interconnections 941-949.

Figure 10:
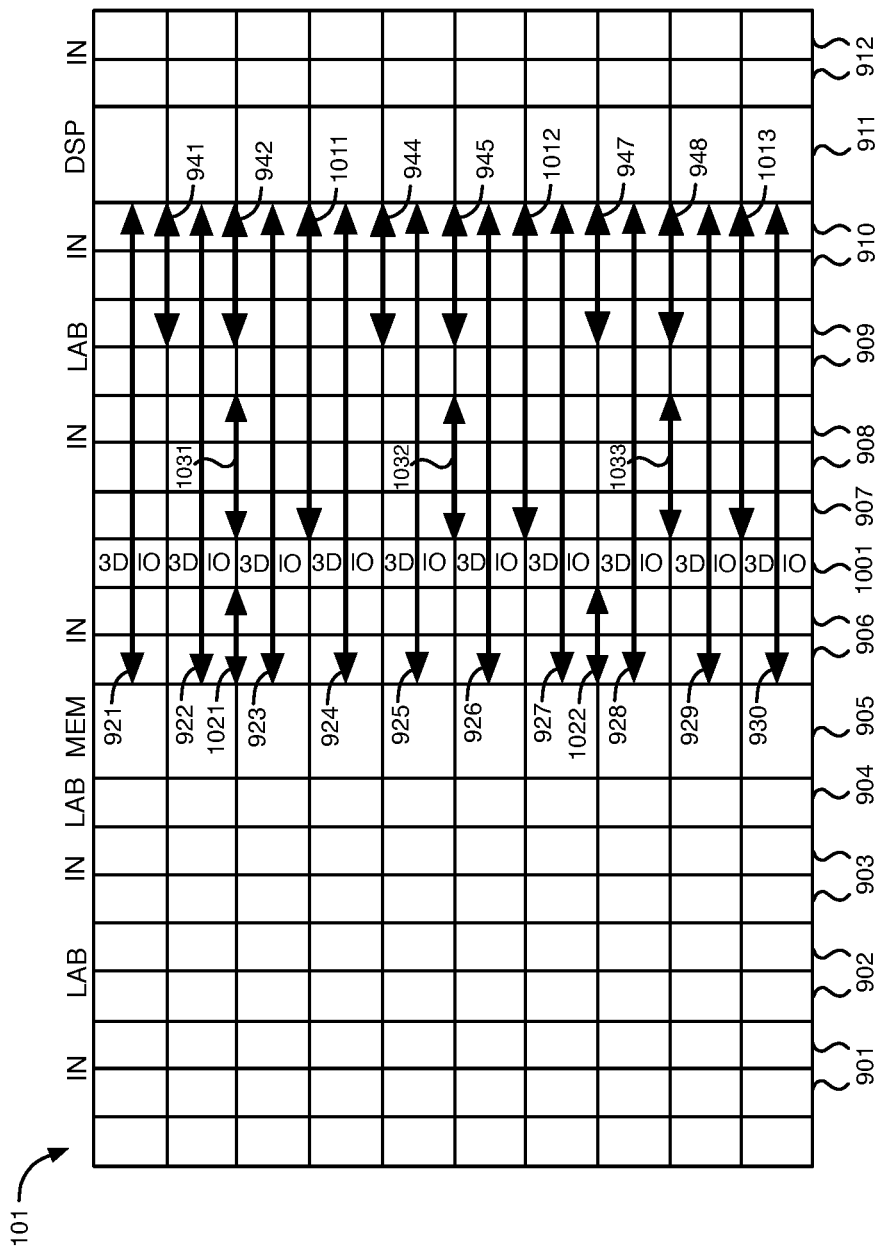
FIG. 10 illustrates another example of the core logic region of the main IC die having three-dimensional (3D) input/output (IO) driver circuits that connect to the aquifer memory in the vertically stacked memory IC die, according to an embodiment.

FIG. 10 illustrates another example of the core logic region 101 of the main IC die having three-dimensional (3D) input/output (IO) driver circuits that connect to the aquifer memory in the vertically stacked memory IC die, according to an embodiment. The core logic region 101 of FIG. 10 includes the interconnections, LABs, memory circuits, and DSP circuits in columns 901-912 that are disclosed herein with respect to FIG. 9. The core logic region 101 of FIG. 10 also includes the interconnections 941-942, 944-945, 947-948, and 921-930 that are disclosed herein with respect to FIG. 9.

In the embodiment of FIG. 10, one of the columns 907 of LABs in FIG. 9 is replaced with a column 1001 of 3D IO driver circuits. The 3D IO driver circuits in column 1001 of FIG. 10 provide direct connections between circuits in the core logic region 101 and the memory circuits in the aquifer memory in the one or more memory IC dies (e.g., memory IC die 305).

In the embodiment of FIG. 10, the core logic region 101 includes interconnections 1011-1013, 1021-1022, and 1031-1033 that couple to the 3D IO driver circuits in column 1001. Interconnections 1011-1013, 1021-1022, and 1031-1033 may be implemented as short vertical and/or horizontal wires. Interconnections 1011-1013, 1021-1022, and 1031-1033 may be programmable or non-programmable. These interconnections may be added to an existing FPGA architecture. In other embodiments, the existing programmable interconnections can be used. In some embodiments, interconnections 1011-1013 may be programmed to couple one or more of the DSP circuits in column 911 to the 3D IO driver circuits in column 1001 so that one or more of the DSP circuits in column 911 can access the aquifer memory in the memory IC die through interconnections 1011-1013 and the 3D IO driver circuits in column 1001. In some embodiments, one or more of the DSP circuits in column 911 of the core logic region 101 of FIG. 10 are designed and/or configured for the computation of artificial intelligence (AI) and machine learning algorithms. In these embodiments, the AI DSP circuits can access the aquifer memory in the memory IC die through interconnections 1011-1013 and the 3D IO driver circuits in column 1001.

In some embodiments, interconnections 1021-1022 may be programmed to couple one or more of the fabric memory circuits in column 905 to the 3D IO driver circuits in column 1001 so that one or more of the fabric memory circuits in column 905 can access the aquifer memory in the memory IC die through interconnections 1021-1022 and the 3D IO driver circuits in column 1001. In some embodiments, interconnections 1031-1033 may be programmed to couple one or more of the logic circuits and/or the memory circuits in the LABs in columns 909 to the 3D IO driver circuits in column 1001 so that one or more of the logic and/or memory circuits in columns 909 can access the aquifer memory in the memory IC die through interconnections 1031-1033 and the 3D IO driver circuits in column 1001.

Figure 11:
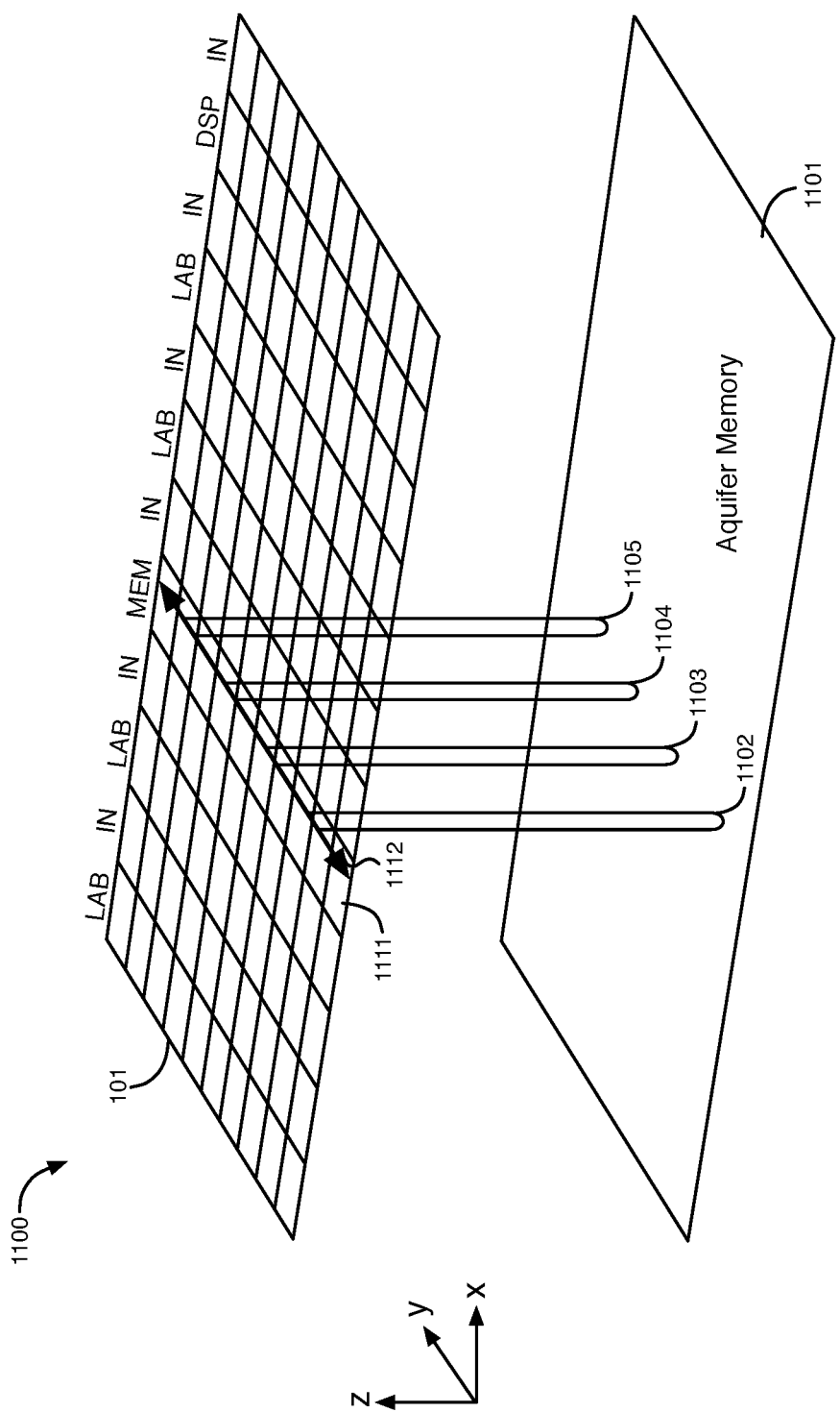
FIG. 11 illustrates an example of a circuit system that includes the core logic region in the main IC die and aquifer memory having direct connections to the fabric memory circuits in the core logic region, according to an embodiment.

FIG. 11 illustrates an example of a circuit system 1100 that includes the core logic region 101 in the main IC die and aquifer memory 1101 having direct connections to the fabric memory circuits in the core logic region 101, according to an embodiment. The main IC die and the aquifer memory 1101 are vertically stacked. The aquifer memory 1101 may include one or multiple memory IC dies. The core logic region 101 in FIG. 11 includes LABs, interconnections (IN), and DSP circuits arranged in columns, as with the embodiments of FIGS. 9-10. The core logic region 101 in FIG. 11 also includes a column 1111 of fabric memory circuits, similar to the column 905 of fabric memory circuits in FIGS. 9-10. In the embodiment of FIG. 11, the column 1111 of fabric memory circuits also includes interconnections 1112 that span the length of column 1111. The interconnections 1112 may be programmable interconnections, for example, if the main IC die is a programmable logic IC. In some embodiments, interconnections 1112 can be directly coupled to the fabric memory circuits without being coupled to programmable interconnections.

Circuit system 1100 also includes aquifer memory 1101 and 4 direct die-to-die connections 1102-1105. Memory IC dies 305, 400, 500, and 610 are examples of aquifer memory 1101. Direct die-to-die connections 1102-1105 are conductive connections between the vertically stacked main IC die and aquifer memory 1101. Die-to-die connections 1102-1105 are parallel to the z axis. Direct die-to-die connections 1102-1105 are coupled to the interconnections 1112 in column 1111. Direct die-to-die connections 1102-1105 couple the memory circuits in the aquifer memory 1101 to the fabric memory circuits in column 1111 of core logic region 101 through interconnections 1112 to allow direct data transfer between the aquifer memory and the fabric memory circuits. The embodiment of FIG. 11 avoids having to use interconnections in other columns of core logic region 101 to couple the fabric memory circuits to the aquifer memory 1101.

Figure 12:
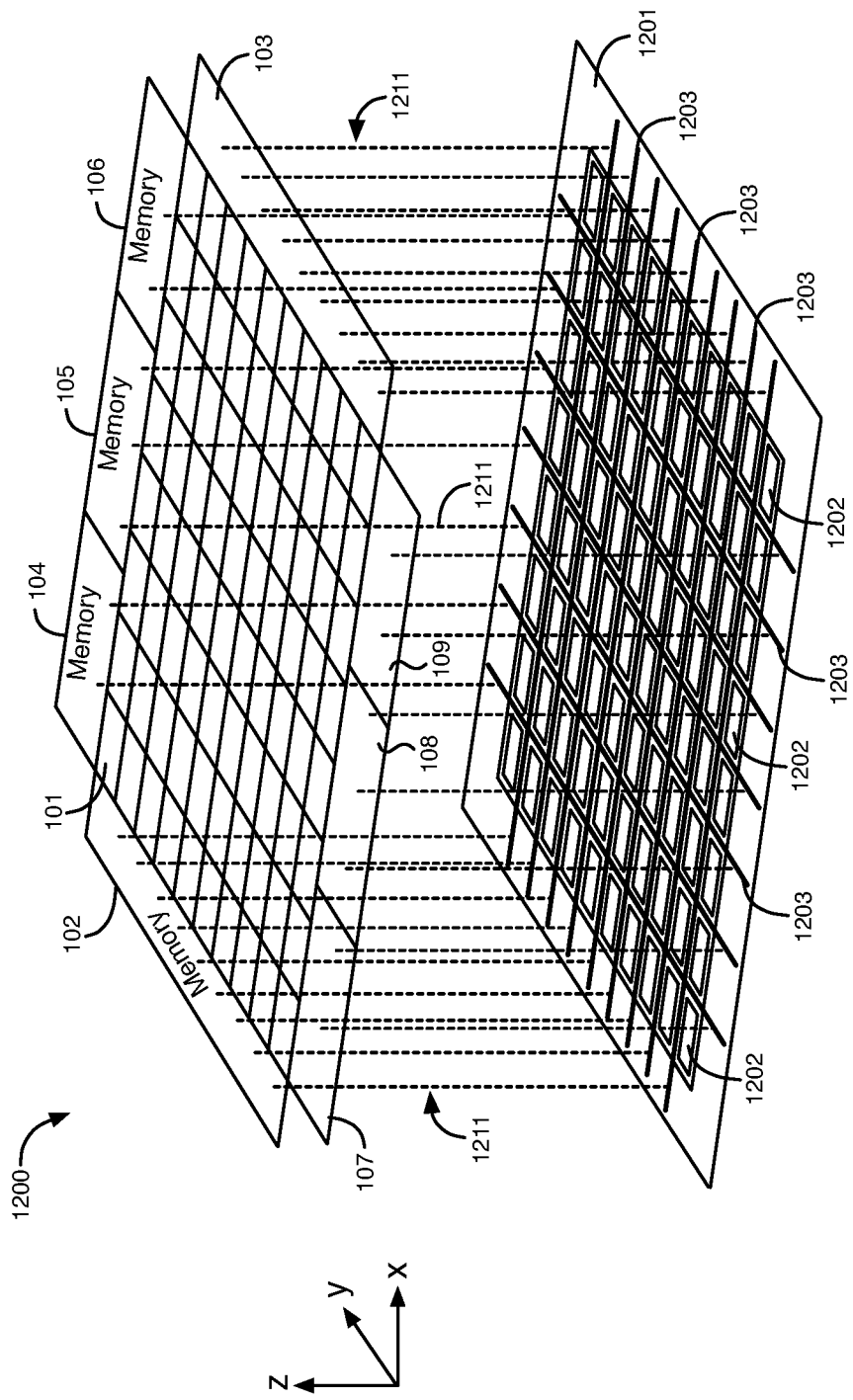
FIG. 12 illustrates an example of a circuit system that includes the core logic region, the shoreline memory circuits, and a memory IC die that includes memory circuits organized into sectors and a network-on-chip that is coupled to the shoreline memory circuits, according to another embodiment.

FIG. 12 illustrates an example of a circuit system 1200 that includes the core logic region 101 in the main IC die, the peripheral region that includes shoreline memory circuits 102-109, and a memory IC die 1201 that includes memory circuits organized into sectors and a network-on-chip between the sectors, according to another embodiment. Memory IC die 1201 is an example of the memory IC die 610 and aquifer memory 1101. In the embodiment of FIG. 12, the aquifer memory in memory IC die 1201 includes memory circuits in sectors 1202. The sectors 1202 are organized into 10 rows and 8 columns of sectors in IC die 1201 in the example of FIG. 12, for a total of 80 sectors 1202. Although, memory IC die 1201 may have any number of sectors 1202 of memory circuits. The sectors 1202 of memory circuits in memory IC die 1201 align vertically with logic sectors in the core logic region 101 of the main IC die.

Memory IC die 1201 includes a network-on-chip (NOC) 1203. The NOC 1203 includes 7 vertical and 9 horizontal groups of conductive interconnections and routers (e.g., as shown in FIG. 7) between the rows and columns of sectors 1202 in the example of FIG. 12. In other embodiments, any number of vertical and horizontal groups of conductive interconnections may be used in the NOC. The memory circuits in sectors 1202 are coupled to the NOC 1203. In some embodiments, the memory circuits in two or more of the sectors 1202 can communicate with each other through the NOC 1203 in the memory IC die 1201. In the embodiment of FIG. 12, the vertical and horizontal groups of interconnections in the NOC 1203 between the rows and columns of sectors 1202 extend to a peripheral region of memory IC die 1201 beyond the edges of sectors 1202.

Circuit system 1200 also includes direct die-to-die connections 1211, shown as dotted lines in FIG. 12, that are coupled to each end of each of the 16 vertical and horizontal groups of the NOC 1203 in the peripheral region of the memory IC die 1201. Direct die-to-die connections 1211 are parallel to the z axis of FIG. 12. Direct die-to-die connections 1211 couple the vertical and horizontal groups of the NOC 1203 to shoreline memory circuits 102-109. Direct die-to-die connections 1211 and NOC 1203 allow direct data transfer between the aquifer memory in sectors 1202 of memory IC die 1201 and the shoreline memory circuits 102-109. Direct die-to-die connections 1211 may include, for example, conductors in the main IC die and the memory IC die 1201 (e.g., through silicon vias) and external conductive connections that connect the main IC die to the memory IC die 1201.

In some embodiments, an application may use the memory hierarchy disclosed herein to refill data through the memory hierarchy to avoid any memory bottlenecks caused by memory capacity, memory access bandwidth, and memory latency limitations. In some embodiments, one or more of the shoreline memory circuits may be removed from the circuit system if the memory capacity, bandwidth, latency, and refill rates of the aquifer memory and the fabric memory are sufficient for the needs of an application domain. The removal of one or more of the shoreline memory circuits reduces cost, IC package area, and circuit board area.

In some embodiments, only the DDR shoreline memory circuits are removed from the circuit system if the memory capacity, bandwidth, latency, and refill rates of the remaining memory circuits are sufficient for the needs of an application domain. In some embodiments, one or both of the Optane™ and HBM shoreline memory circuits are removed from the circuit system if the memory capacity, bandwidth, latency, and refill rates of the remaining memory circuits are sufficient for the needs of an application domain. In all of the embodiments disclosed herein, the aquifer memory provides an intermediate memory that may help to increase memory refill rates and enables the depopulation of the shoreline memory circuits in particular application domain scenarios.

In some embodiments, the aquifer memory in the memory IC die decompresses data received from the shoreline memory circuits to increase the effective bandwidth from the shoreline memory circuits and to increase the effective memory capacity of the shoreline memory circuits. In some embodiments, the aquifer memory compresses the data transferred to the shoreline memory circuits to increase the effective bandwidth to the shoreline memory circuits and to increase the effective memory capacity of the shoreline memory circuits. In some embodiments, the compression and decompression of data transferred between the aquifer memory and the shoreline memory circuits are specialized for the application domain.

In some embodiments, the aquifer memory decompresses data before sending the data to the fabric memory to increase the effective memory capacity of the aquifer memory. In some embodiments, the aquifer memory compresses data received from the fabric memory to increase the effective memory capacity of the aquifer memory. In some embodiments, the compression and decompression of data transferred between the aquifer memory and the fabric memory are specialized for the application domain.

In some embodiments, circuits in the core logic region 101 decompress data received from the aquifer memory to increase the effective bandwidth of data transferred to the fabric memory and to increase the effective memory capacity of the aquifer memory. In some embodiments, circuits in the core logic region 101 compress data transferred to the aquifer memory to increase the effective bandwidth of data transferred from the fabric memory and to increase the effective memory capacity of the aquifer memory. In some embodiments, the compression and decompression of data transferred between the aquifer memory and the core logic region 101 are specialized for the application domain.

The following examples pertain to further embodiments. Example 1 is a circuit system comprising: a first integrated circuit die comprising a core logic region, wherein the core logic region comprises first memory circuits and logic circuits; a second integrated circuit die comprising second memory circuits, wherein the first and second integrated circuit dies are coupled together in a vertically stacked configuration; and a third integrated circuit die comprising third memory circuits, wherein the third integrated circuit die is coupled to the first integrated circuit die and resides in a plane of the first integrated circuit die, wherein the logic circuits are coupled to access the first, second, and third memory circuits, wherein the third memory circuits have a larger memory capacity and a smaller memory access bandwidth than the second memory circuits, and wherein the second memory circuits have a larger memory capacity and a smaller memory access bandwidth than the first memory circuits.

In Example 2, the circuit system of Example 1 may optionally include, wherein the core logic region further comprises digital signal processing circuits that are coupled to access the first, second, and third memory circuits, and wherein the first integrated circuit die further comprises input/output circuits that couple the logic circuits, the first memory circuits, and the digital signal processing circuits to the second memory circuits through die-to-die connections that are perpendicular to the plane of the first integrated circuit die.

In Example 3, the circuit system of any one of Examples 1-2 may optionally further comprise: a fourth integrated circuit die comprising fourth memory circuits and additional logic circuits, wherein the first memory circuits have a larger memory capacity and a smaller memory access bandwidth than the fourth memory circuits; a fifth integrated circuit die comprising fifth memory circuits, wherein the second memory circuits have a larger memory capacity and a smaller memory access bandwidth than the fifth memory circuits, the fourth and fifth integrated circuit dies are coupled together in a vertically stacked configuration; and a sixth integrated circuit die comprising sixth memory circuits, wherein the third memory circuits have a larger memory capacity and a smaller memory access bandwidth than the sixth memory circuits, wherein the sixth integrated circuit die is coupled to the fourth integrated circuit die and resides in a plane of the fourth integrated circuit die, and wherein the additional logic circuits are coupled to access the fourth, fifth, and sixth memory circuits.

In Example 4, the circuit system of any one of Examples 1-3 may optionally include, wherein the logic circuits are arranged in first sectors, wherein the second memory circuits are arranged in second sectors, and wherein each of the first sectors is coupled to one of the second sectors through a die-to-die connection that is perpendicular to the plane of the first integrated circuit die and that is coupled to the first and second integrated circuit dies.

In Example 5, the circuit system of any one of Examples 1-4 may optionally include, wherein each of the second memory circuits comprises first level memories and a second level memory, wherein the core logic region further comprises memory direct access circuits, and wherein each of the memory direct access circuits has access to one of the first level memories and a partition of the second level memory in one of the second memory circuits.

In Example 6, the circuit system of Example 5 may optionally include, wherein the second integrated circuit die further comprises memory controller prefetch engine circuits, wherein each of the memory controller prefetch engine circuits is coupled to one of the second memory circuits, and wherein each of the memory controller prefetch engine circuits pre-fetches data stored in one of the first level memories and the second level memory in one of the second memory circuits.

In Example 7, the circuit system of any one of Examples 1-6 may optionally include, wherein the second memory circuits are arranged in sectors, wherein the second integrated circuit die further comprises a network-on-chip and bridge circuits coupled to the network-on-chip, wherein each of the bridge circuits is coupled to at least one of the second memory circuits in one of the sectors, and wherein the network-on-chip and the bridge circuits are configured to transfer data between the sectors containing the second memory circuits.

In Example 8, the circuit system of Example 7 may optionally include, wherein the network-on-chip is coupled to the third memory circuits through die-to-die connections that are perpendicular to the plane of the first integrated circuit die.

In Example 9, the circuit system of any one of Examples 1-8 may optionally include, wherein the first memory circuits are coupled to the second memory circuits through interconnections in the first integrated circuit die and through die-to-die connections that are perpendicular to the plane of the first integrated circuit die.

In Example 10, the circuit system of any one of Examples 1-9 may optionally include, wherein the first integrated circuit die further comprises accessor circuits that access the second memory circuits through die-to-die connections between the first and second integrated circuit dies, wherein each of the accessor circuits is allocated to a physical address space in the second memory circuits, and wherein the physical address space allocated to a first one of the accessor circuits overlaps with the physical address space allocated to a second one of the accessor circuits.

In Example 11, the circuit system of Example 10 may optionally include, wherein the second integrated circuit die further comprises memory mapping circuits that map a logical address space received from the first integrated circuit die to the physical address space in the second memory circuits, and wherein the memory mapping circuits provide access control to the second memory circuits from the core logic region.

In Example 12, the circuit system of any one of Examples 1-11 may optionally include, wherein a software compiler determines an optimal usage and configuration of resources in the first and second integrated circuit dies for a workload, and wherein the software compiler physically aligns logic resources in the core logic region with the second memory circuits to maximize memory access bandwidth during runtime.

In Example 13, the circuit system of any one of Examples 1-12 may optionally include, wherein the second integrated circuit die further comprises compute logic circuits.

Example 14 is a three dimensional circuit system comprising: a first integrated circuit die comprising a core logic region and a peripheral region, wherein the core logic region comprises first memory circuits and logic circuits, and wherein the peripheral region comprises second memory circuits; and a second integrated circuit die comprising third memory circuits, wherein the first and second integrated circuit dies are coupled together in a vertically stacked configuration, wherein the logic circuits are coupled to access the first, second, and third memory circuits, wherein the second memory circuits have a larger memory capacity and a smaller memory access bandwidth than the third memory circuits, and wherein the third memory circuits have a larger memory capacity and a smaller memory access bandwidth than the first memory circuits.

In Example 15, the three dimensional circuit system of Example 14 may optionally include, wherein each of the third memory circuits comprises first level memories and a second level memory, wherein the core logic region further comprises memory direct access circuits, and wherein each of the memory direct access circuits has access to one of the first level memories and a partition of the second level memory in one of the third memory circuits.

In Example 16, the three dimensional circuit system of Example 15 may optionally include, wherein the second integrated circuit die further comprises memory controller prefetch engine circuits coupled to the third memory circuits, and wherein each of the memory controller prefetch engine circuits pre-fetches data stored in the third memory circuits and provides the pre-fetched data to one of the memory direct access circuits.

In Example 17, the three dimensional circuit system of any one of Examples 14-16 may optionally include, wherein the third memory circuits are arranged in sectors, wherein the second integrated circuit die further comprises a network-on-chip and bridge circuits coupled to the network-on-chip, wherein each of the bridge circuits is coupled to one of the third memory circuits in one of the sectors, and wherein the network-on-chip and the bridge circuits are configured to transfer data between the third memory circuits in the sectors.

In Example 18, the three dimensional circuit system of Example 17 may optionally include, wherein the network-on-chip is coupled to the second memory circuits through die-to-die connections that are perpendicular to a plane of the first integrated circuit die.

In Example 19, the three dimensional circuit system of any one of Examples 14-18 may optionally further comprise: fourth memory circuits that are located around a periphery of the third memory circuits and that reside in a plane of the second integrated circuit die, wherein the logic circuits are coupled to access the fourth memory circuits, and wherein the fourth memory circuits have a larger memory capacity and a smaller memory access bandwidth than the first and third memory circuits.

Example 20 is a method for fabricating a three dimensional circuit system, the method comprising: providing a first integrated circuit die comprising a core logic region, wherein the core logic region comprises first memory circuits and logic circuits; providing a second integrated circuit die comprising second memory circuits, wherein the first and second integrated circuit dies are coupled together through die-to-die connections that are perpendicular to a plane along a length and width of the first integrated circuit die; and providing third memory circuits that lie in the plane, wherein the logic circuits are coupled to access the first, second, and third memory circuits, wherein the third memory circuits have a larger memory capacity and a smaller memory access bandwidth than the second memory circuits, and wherein the second memory circuits have a larger memory capacity and a smaller memory access bandwidth than the first memory circuits.

In Example 21, the method of Example 20 may optionally include, wherein the third memory circuits are in a third integrated circuit die, and wherein a length and a width of the third integrated circuit die are in the plane.

In Example 22, the method of Example 20 may optionally include, wherein the third memory circuits are in a peripheral region of the first integrated circuit die.

In Example 23, the method of any one of Examples 20-22 may optionally include, wherein the logic circuits are arranged in first sectors, wherein the second memory circuits are arranged in second sectors, and wherein each of the first sectors is coupled to one of the second sectors through one of the die-to-die connections.

The foregoing description of the exemplary embodiments has been presented for the purpose of illustration. The foregoing description is not intended to be exhaustive or to be limiting to the examples disclosed herein. The foregoing is merely illustrative of the principles of this disclosure and various modifications can be made by those skilled in the art. The foregoing embodiments may be implemented individually or in any combination.

What is claimed is:

1. A circuit system comprising:
a first integrated circuit die comprising a core logic region, wherein the core logic region comprises first memory circuits and logic circuits;
a second integrated circuit die comprising second memory circuits, wherein the first and second integrated circuit dies are coupled together in a vertically stacked configuration through die-to-die connections; and
a third integrated circuit die comprising third memory circuits, wherein the third integrated circuit die is coupled to the first integrated circuit die and resides in a plane of the first integrated circuit die that is perpendicular to the die-to-die connections, wherein the logic circuits are coupled to access the first, second, and third memory circuits, wherein the third memory circuits have a larger memory capacity and a smaller memory access bandwidth than the second memory circuits, and wherein the second memory circuits have a larger memory capacity and a smaller memory access bandwidth than the first memory circuits.

2. The circuit system of claim 1, wherein the core logic region further comprises digital signal processing circuits that are coupled to access the first, second, and third memory circuits, and wherein the first integrated circuit die further comprises input/output circuits that couple the logic circuits, the first memory circuits, and the digital signal processing circuits to the second memory circuits through the die-to-die connections that are perpendicular to the plane of the first integrated circuit die.

3. The circuit system of claim 1 further comprising:
a fourth integrated circuit die comprising fourth memory circuits and additional logic circuits, wherein the first memory circuits have a larger memory capacity and a smaller memory access bandwidth than the fourth memory circuits;
a fifth integrated circuit die comprising fifth memory circuits, wherein the second memory circuits have a larger memory capacity and a smaller memory access bandwidth than the fifth memory circuits, the fourth and fifth integrated circuit dies are coupled together in a vertically stacked configuration; and
a sixth integrated circuit die comprising sixth memory circuits, wherein the third memory circuits have a larger memory capacity and a smaller memory access bandwidth than the sixth memory circuits, wherein the sixth integrated circuit die is coupled to the fourth integrated circuit die and resides in a plane of the fourth integrated circuit die, and wherein the additional logic circuits are coupled to access the fourth, fifth, and sixth memory circuits.

4. The circuit system of claim 1, wherein the logic circuits are arranged in first sectors, wherein the second memory circuits are arranged in second sectors, and wherein each of the first sectors is coupled to one of the second sectors through one of the die-to-die connections that is coupled to the first and second integrated circuit dies.

5. The circuit system of claim 1, wherein each of the second memory circuits comprises first level memories and a second level memory, wherein the core logic region further comprises memory direct access circuits, and wherein each of the memory direct access circuits has access to one of the first level memories and a partition of the second level memory in one of the second memory circuits.

6. The circuit system of claim 5, wherein the second integrated circuit die further comprises memory controller prefetch engine circuits, wherein each of the memory controller prefetch engine circuits is coupled to one of the second memory circuits, and wherein each of the memory controller prefetch engine circuits pre-fetches data stored in one of the first level memories and the second level memory in one of the second memory circuits.

7. The circuit system of claim 1, wherein the second memory circuits are arranged in sectors, wherein the second integrated circuit die further comprises a network-on-chip and bridge circuits coupled to the network-on-chip, wherein each of the bridge circuits is coupled to at least one of the second memory circuits in one of the sectors, and wherein the network-on-chip and the bridge circuits are configured to transfer data between the sectors containing the second memory circuits.

8. The circuit system of claim 7, wherein the network-on-chip is coupled to the third memory circuits through the die-to-die connections that are perpendicular to the plane of the first integrated circuit die.

9. The circuit system of claim 1, wherein the first memory circuits are coupled to the second memory circuits through interconnections in the first integrated circuit die and through the die-to-die connections that are perpendicular to the plane of the first integrated circuit die.

10. The circuit system of claim 1, wherein the first integrated circuit die further comprises accessor circuits that access the second memory circuits through the die-to-die connections between the first and second integrated circuit dies, wherein each of the accessor circuits is allocated to a physical address space in the second memory circuits, and wherein the physical address space allocated to a first one of the accessor circuits overlaps with the physical address space allocated to a second one of the accessor circuits.

11. The circuit system of claim 10, wherein the second integrated circuit die further comprises memory mapping circuits that map a logical address space received from the first integrated circuit die to the physical address space in the second memory circuits, and wherein the memory mapping circuits provide access control to the second memory circuits from the core logic region.

12. The circuit system of claim 1, wherein a software compiler determines an optimal usage and configuration of resources in the first and second integrated circuit dies for a workload, and wherein the software compiler physically aligns logic resources in the core logic region with the second memory circuits to maximize memory access bandwidth during runtime.

13. The circuit system of claim 1, wherein the second integrated circuit die further comprises compute logic circuits.

14. A three dimensional circuit system comprising:
a first integrated circuit die comprising a core logic region and a peripheral region, wherein the core logic region comprises first memory circuits and logic circuits, and wherein the peripheral region comprises second memory circuits; and
a second integrated circuit die comprising third memory circuits, wherein the first and second integrated circuit dies are coupled together in a vertically stacked configuration, wherein the logic circuits are coupled to access the first, second, and third memory circuits, wherein the second memory circuits have a different memory capacity and a different memory access bandwidth than the third memory circuits, and wherein the third memory circuits have a different memory capacity and a different memory access bandwidth than the first memory circuits,
wherein each of the third memory circuits comprises first level memories and a second level memory, wherein the core logic region further comprises memory direct access circuits, and wherein each of the memory direct access circuits has access to one of the first level memories and a partition of the second level memory in one of the third memory circuits.

15. The three dimensional circuit system of claim 14, wherein the first integrated circuit die further comprises accessor circuits that access the third memory circuits, wherein each of the accessor circuits is allocated to a physical address space in the third memory circuits, and wherein the physical address space allocated to a first one of the accessor circuits overlaps with the physical address space allocated to a second one of the accessor circuits.

16. The three dimensional circuit system of claim 14, wherein the second integrated circuit die further comprises memory controller prefetch engine circuits coupled to the third memory circuits, and wherein each of the memory controller prefetch engine circuits pre-fetches data stored in the third memory circuits and provides the pre-fetched data to one of the memory direct access circuits.

17. The three dimensional circuit system of claim 14, wherein the third memory circuits are arranged in sectors, wherein the second integrated circuit die further comprises a network-on-chip and bridge circuits coupled to the network-on-chip, wherein each of the bridge circuits is coupled to one of the third memory circuits in one of the sectors, and wherein the network-on-chip and the bridge circuits are configured to transfer data between the third memory circuits in the sectors.

18. The three dimensional circuit system of claim 17, wherein the network-on-chip is coupled to the second memory circuits through die-to-die connections that are perpendicular to a plane of the first integrated circuit die.

19. A three dimensional circuit system comprising:
a first integrated circuit die comprising a core logic region and a peripheral region, wherein the core logic region comprises first memory circuits and logic circuits, and wherein the peripheral region comprises second memory circuits;
a second integrated circuit die comprising third memory circuits, wherein the first and second integrated circuit dies are coupled together in a vertically stacked configuration, wherein the logic circuits are coupled to access the first, second, and third memory circuits, wherein the second memory circuits have a larger memory capacity and a smaller memory access bandwidth than the third memory circuits, and wherein the third memory circuits have a larger memory capacity and a smaller memory access bandwidth than the first memory circuits; and
fourth memory circuits that are located around a periphery of the third memory circuits and that reside in a plane of the second integrated circuit die, wherein the logic circuits are coupled to access the fourth memory circuits, and wherein the fourth memory circuits have a larger memory capacity and a smaller memory access bandwidth than the first and third memory circuits.

20. A method for fabricating a three dimensional circuit system, the method comprising:
providing a first integrated circuit die comprising a core logic region, wherein the core logic region comprises first memory circuits and logic circuits;
providing a second integrated circuit die comprising second memory circuits, wherein the first and second integrated circuit dies are coupled together through die-to-die connections that are perpendicular to a plane along a length and width of the first integrated circuit die; and
providing third memory circuits that lie in the plane in a third integrated circuit die, wherein the logic circuits are coupled to access the first, second, and third memory circuits, wherein the third memory circuits have a larger memory capacity and a smaller memory access bandwidth than the second memory circuits, and wherein the second memory circuits have a larger memory capacity and a smaller memory access bandwidth than the first memory circuits.

21. The method of claim 20, wherein a length and a width of the third integrated circuit die are in the plane, and wherein the first integrated circuit die further comprises accessor circuits that access the second memory circuits through the die-to-die connections.

22. The method of claim 20, wherein the third memory circuits are in a peripheral region of the first integrated circuit die.

23. The method of claim 20, wherein the logic circuits are arranged in first sectors, wherein the second memory circuits are arranged in second sectors, and wherein each of the first sectors is coupled to one of the second sectors through one of the die-to-die connections.

* * * * *